(12) United States Patent
Kasukabe et al.

(10) Patent No.: US 7,656,174 B2
(45) Date of Patent: Feb. 2, 2010

(54) PROBE CASSETTE, SEMICONDUCTOR INSPECTION APPARATUS AND MANUFACTURING METHOD OF SEMICONDUCTOR DEVICE

(75) Inventors: Susumu Kasukabe, Yokohama (JP); Yasunori Narizuka, Yokohama (JP)

(73) Assignee: Renesas Technology Corp., Tokyo (JP)

( * ) Notice: Subject to any disclaimer, the term of this patent is extended or adjusted under 35 U.S.C. 154(b) by 72 days.

(21) Appl. No.: 11/572,033

(22) PCT Filed: Jul. 14, 2005

(86) PCT No.: PCT/JP2005/013025
§ 371 (c)(1),
(2), (4) Date: Aug. 2, 2007

(87) PCT Pub. No.: WO2006/009061
PCT Pub. Date: Jan. 26, 2006

(65) Prior Publication Data
US 2007/0279074 A1    Dec. 6, 2007

(30) Foreign Application Priority Data
Jul. 15, 2004  (JP)  ............................. 2004-208213

(51) Int. Cl.
*G01R 31/02* (2006.01)
(52) U.S. Cl. .................. 324/754; 324/756; 324/757; 324/761
(58) Field of Classification Search .................. None
See application file for complete search history.

(56) References Cited

U.S. PATENT DOCUMENTS

| | | | | |
|---|---|---|---|---|
| 5,945,834 A | * | 8/1999 | Nakata et al. | 324/754 |
| 6,215,321 B1 | * | 4/2001 | Nakata | 324/754 |
| 6,496,023 B1 | | 12/2002 | Kanamaru et al. | |
| 6,507,204 B1 | * | 1/2003 | Kanamaru et al. | 324/754 |
| 6,784,681 B2 | * | 8/2004 | Fujimoto et al. | 324/765 |
| 7,227,370 B2 | * | 6/2007 | Kasukabe | 324/754 |
| 2002/0105354 A1 | | 8/2002 | Fujimoto et al. | |
| 2003/0013249 A1 | | 1/2003 | Honma et al. | |
| 2003/0061606 A1 | | 3/2003 | Hartwig et al. | |

(Continued)

FOREIGN PATENT DOCUMENTS

JP          07-283280          10/1995

(Continued)

*Primary Examiner*—Minh N Tang
(74) *Attorney, Agent, or Firm*—Antonelli, Terry, Stout & Kraus, LLP.

(57) ABSTRACT

A manufacturing method of a semiconductor device employing a semiconductor inspection apparatus to accurately inspect semiconductor elements while still in the wafer state, the semiconductor inspection apparatus including: a probe sheet 31 having contact terminals 7 which contact electrodes 3 of a wafer 1 and contact bumps 20b electrically connected to respective contact terminals 7; and a probe sheet 34 which is backed by a metal film 30b and having contact electrodes 34a which contact the contact bumps 20b of the probe sheet 31 and peripheral electrodes 27b electrically connected to the respective contact electrodes 34a, the wafer 1 is interposed between the probe sheet 34 and the supporting member 33 via the probe sheet 31 by reducing pressure through vacuuming, and the contact terminals 7 which have a pyramidal or truncated shape are contacted to the electrodes 3 of the wafer 1 at a desired atmospheric pressure, thereby performing the inspection.

9 Claims, 25 Drawing Sheets

U.S. PATENT DOCUMENTS

2003/0102880 A1    6/2003    Kanamaru et al.
2003/0122550 A1    7/2003    Kanamaru et al.

FOREIGN PATENT DOCUMENTS

| | | |
|---|---|---|
| JP | 11-135582 | 5/1999 |
| JP | 2002-82130 | 3/2002 |
| JP | 2002-163900 | 6/2002 |
| JP | 2002-303652 | 10/2002 |
| JP | 2003-45924 | 2/2003 |

* cited by examiner

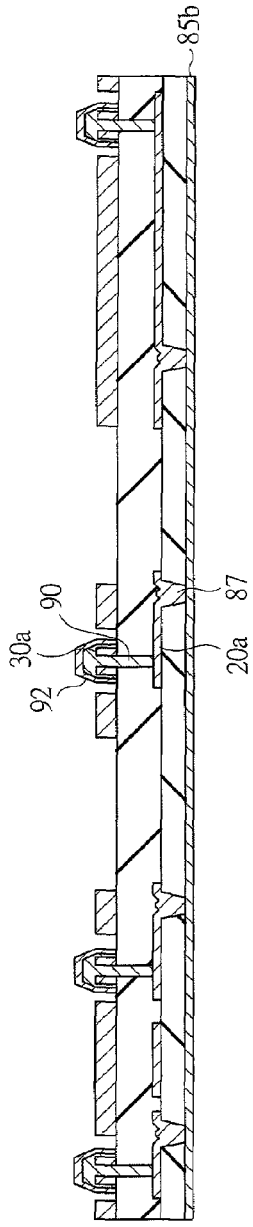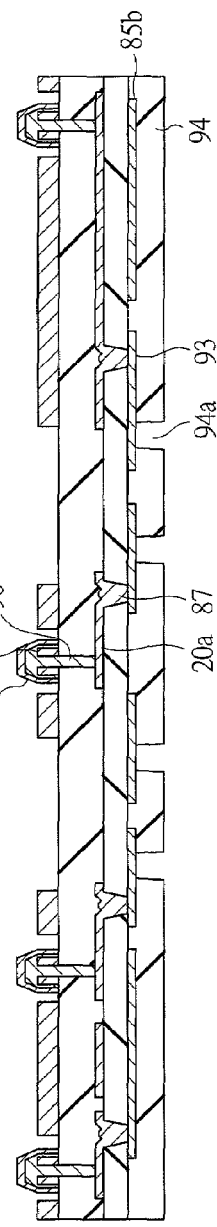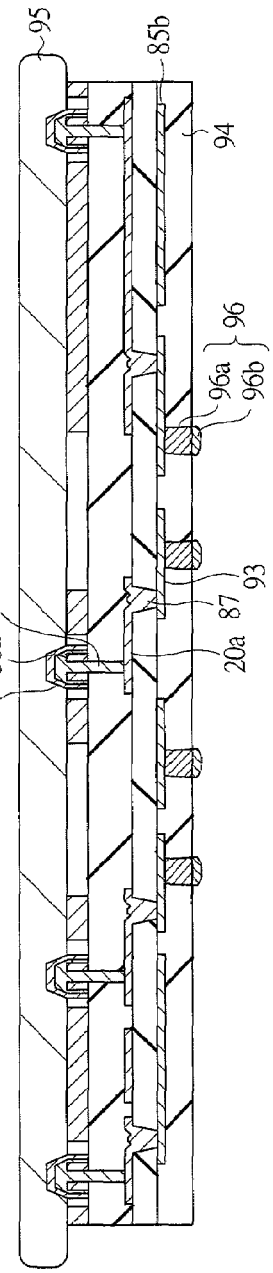

DIVIDING LINE

PROBE CASSETTE, SEMICONDUCTOR INSPECTION APPARATUS AND MANUFACTURING METHOD OF SEMICONDUCTOR DEVICE

TECHNICAL FIELD

The present invention relates to a technology for manufacturing a semiconductor device. More specifically, it relates to a technology effectively applied to a probe cassette using a probe sheet, a semiconductor inspection apparatus using the probe cassette, and a manufacturing method of a semiconductor device using the semiconductor inspection apparatus.

BACKGROUND ART

As the technologies for manufacturing a semiconductor device, the following technologies are known.

For example, in the manufacturing process of a semiconductor device, after forming semiconductor circuits on a wafer, an assembly step is carried out, through which products such as packaged products, bare chips, and CSPs (Chip Size Packages) which are typical shipping forms of semiconductor devices are formed. Inspections performed in the manufacturing process of such semiconductor devices are roughly sorted into the following three inspections. The first is wafer inspection for checking the conduction state and the electrical signal operating state of semiconductor elements, which is performed in a wafer state in which semiconductor circuits and electrodes are formed on a wafer. The second is burn-in test in which semiconductor elements are placed in a high-temperature state so as to eliminate unstable semiconductor elements. The third is sorting inspection for checking the product performance before shipping the semiconductor devices.

Numerous semiconductor devices (chips) are provided on the surface of such a wafer, and they are individually separated and then used. The individually separated semiconductor devices have many electrodes arranged on their surfaces. In order to inspect the electrical characteristics of such semiconductor devices mass-produced industrially, a connecting device comprising probes formed of tungsten needles obliquely projecting from a probe card (hereinafter, referred to as Conventional technology 1) has been employed. Inspections by use of the connecting device employ a method in which contact is made by scratching the electrodes with the contact pressure utilizing flexibility of the probes and then the electrical characteristics thereof are inspected.

Also, as another conventional technology, for example, the technology described in Patent Document 1 (hereinafter, referred to as Conventional technology 2) is known. This technology discloses an inspection system as follows. That is, contact terminals which are formed with using the holes formed by anisotropic etching of silicon as casts are formed on the wiring on a flexible insulating film, and a probe sheet fixing substrate which is fixed to the rear surface side of the contact terminal forming surface of the insulating film with interposing a buffer layer therebetween is overlapped on a wafer support substrate in which the wafer on which the semiconductor devices to be inspected are formed is fixed to a wafer-shaped groove of the wafer support substrate. By this means, the tip surfaces of the contact terminals are brought into contact with the surfaces of the electrodes of the wafer to take the electrical connection. Then, the semiconductor devices are inspected.

Furthermore, as still another conventional technology, for example, the technology described in Patent Document 2 (hereinafter, referred to as Conventional technology 3) is known. This technology discloses a burn-in wafer cassette as follows. That is, a probe sheet including bumps which penetrate polyimide resin and serve as contact terminals, wiring board in contact with the sheet via anisotropic conductive rubber on the rear surface thereof, and a wafer tray on which the wafer is placed are sealed with a circular sealing member provided outside the wafer mounting part, and the pressure of the space between the wiring board and the wafer tray sealed by the sealing member is reduced. By this means, the tip surfaces of the contact terminals of the probe sheet are brought into contact with the surfaces of the electrodes of the wafer, thereby taking the electrical connection. Then, the semiconductor devices are inspected.

Patent Document 1: Japanese Patent Application Laid-Open Publication No. 07-283280
Patent Document 2: Japanese Patent Application Laid-Open Publication No. 11-135582

DISCLOSURE OF THE INVENTION

Problem to be Solved by the Invention

Incidentally, in the technologies for manufacturing a semiconductor device as described above, for example, in the above-mentioned conventional technology 1, with respect to contacted materials that produce oxides on material surfaces such as an aluminum electrode and a solder electrode, the probe made of tungsten needle secures the contact by scratching the contact terminal to the electrode to scratch off the oxides on the electrode material surface so as to contact its underlying metal conductive material. As a result, since the electrode is scratched by the contact terminal, shavings of the scratched electrode material are produced, which causes the short circuit between wires and the occurrence of foreign matters. Further, since contact is secured by scratching the probe to the electrode with a load of several hundred mN or more, electrodes are often damaged. In addition, if the electrode surface is rough at the time of the wire bonding to electrode after the probing or at the time of forming the connection bump, a connection failure occurs, which is a factor to deteriorate the reliability.

Moreover, in the inspection process using such a probe card, since the arrangement of the probes has spatial limit, the probe card cannot deal with the density increase and narrower pitches in electrode pads for inspection of semiconductor devices, the increase in the number of electrode pads, and the positional accuracy of the probe tips in a large area. Further, in the above-described probing method, since bare probe length is long due to the shape and relative arrangement of the probes, cross talk occurs and the waveforms are disturbed when high-speed signals are used. Therefore, accurate inspection cannot be performed.

On the other hand, in the above-described conventional technology 2, since the contact terminals are formed by using the holes which are formed by the etching of silicon, the terminals can be accurately applied to the electrode arrangement of the semiconductor elements formed at arbitrary pitches. Therefore, there is no problem when one of the semiconductor elements of the wafer is inspected by this structure. However, it is difficult to handle the case when a plurality of semiconductor elements in a wafer state are to be collectively inspected at one time because electronic components (resistances, capacitors, fuses, and others) for inspection circuits have to be mounted as close as possible to each of the semiconductor elements. Moreover, since the area is increased, it is strongly required to ensure the positional accuracy which is affected by contraction/expansion of the constituent members during fabrication of the probe sheet and the positional accuracy of the tips of the contact terminals which is affected by, for example, difference in linear expansion coefficient of the constituent members (probe sheet and silicon wafer) due to temperature difference in inspection. In addition, this technology has a problem that fine adjustment of the applied load is difficult because contact pressure load is controlled only by applying the pressure to the buffer layer.

On the other hand, in the above-described conventional technology 3, since the contact terminals are formed of conventional hemispherical plating bumps, it is difficult to stabilize the contact resistance value to the electrodes of the semiconductor elements, and the uniformity in height of tips is difficult to be ensured in a large area. In addition, the fine adjustment of the applied load is difficult since the contact pressure load is controlled through the elasticity of the anisotropic conductive rubber serving as a conductor located at the back of the contact terminals. Furthermore, since the pitch with which the anisotropic conductive rubber can be fabricated limits the pitches of the contact terminals, it is difficult to form a narrow-pitch probe card in which contact resistance values are stable and the wiring resistance values are low.

As described above, any of the conventional technologies do not provide satisfactory considerations capable of realizing simple-structure inspection methods, in which positional accuracy of the contact terminal tips is ensured without damaging the target to be inspected and the contact terminals and the contact resistance values are stable at low load, in the multi-pin probing which can collectively inspect a wafer with a large area on which a plurality of semiconductor elements are formed.

Moreover, along with the recent efficiency improvement in the semiconductor element inspection process, the technology for the simultaneous inspection of numerous semiconductor elements (chips) has been developed, and full-wafer inspection for ultimately inspecting chips on the entire wafer at one time has been desired. In addition, operation tests at a high temperature (for example, 85° C. to 150° C.) for more clearly checking and ensuring the reliability have been desired to be performed. Therefore, the inspection apparatus that can deal with them has been desired.

Therefore, an object of the present invention is to provide a full wafer inspection apparatus that can collectively and precisely inspect semiconductor elements formed on a wafer with stable contact resistance value, while securing the positional accuracy of the tips of the contact terminals.

Further, another object of the present invention is to provide a structure in which electronic components for inspection circuits can be mounted in the vicinity of the contact terminals and a manufacturing method of a semiconductor device capable of improving the electrical characteristics and reliability.

Furthermore, still another object of the present invention is to provide a manufacturing method of a semiconductor device capable of reducing the overall production cost of semiconductor devices by improving assembly property of probe sheet having contact terminals formed thereon, simplifying procedures and works of inspection process, and reducing assembly costs of inspection apparatus to reduce the costs of the inspection process of semiconductor devices.

The above and other objects and novel characteristics of the present invention will be apparent from the description of this specification and the accompanying drawings.

Means for Solving the Problems

The typical ones of the inventions disclosed in this application for achieving the objects described above will be briefly described as follows.

(1) A probe cassette according to the present invention comprises: a probe sheet including a plurality of contact terminals which contact electrodes provided on a target to be inspected, wires led out from the plurality of contact terminals, a plurality of peripheral electrodes electrically connected to the wires, and connection terminals for a tester connected to first peripheral electrodes among the plurality of peripheral electrodes; and a supporting member which interposes the target to be inspected with the probe sheet, wherein, in the probe sheet, second peripheral electrodes among the plurality of peripheral electrodes are formed as terminals of parts for an inspection circuit, and the plurality of contact terminals are formed so as to have a pyramidal or truncated pyramidal shape. Also, the probe sheet includes a metal film formed so as to surround the plurality of contact terminals, means for reducing pressure in a space between the probe sheet and the supporting member is provided, and the probe sheet can be replaced in accordance with types of inspection.

(2) Another probe cassette according to the present invention comprises: a first probe sheet including a plurality of contact terminals which contact electrodes provided on a target to be inspected, wires led out from the plurality of contact terminals, and a plurality of first contact electrodes electrically connected to the wires; a second probe sheet including a plurality of second contact electrodes which contact the plurality of first contact electrodes of the first probe sheet, a plurality of peripheral electrodes electrically connected to the plurality of second contact electrodes, and connection terminals for a tester connected to first peripheral electrodes among the plurality of peripheral electrodes; and a supporting member which interposes the target to be inspected with the second probe sheet via the first probe sheet, wherein, in the second probe sheet, second peripheral electrodes among the plurality of peripheral electrodes are formed as terminals of parts for an inspection circuit, and in the first probe sheet, the plurality of contact terminals are formed so as to have a pyramidal or truncated pyramidal shape. Also, the first probe sheet includes a metal film formed so as to surround the plurality of contact terminals, means for reducing pressure in a space between the first probe sheet and the supporting member and means for reducing pressure in a space between the second probe sheet and the supporting member are provided, and the second probe sheet can be replaced in accordance with types of inspection and the first probe sheet is used in common irrespective of the types of inspection.

(3) A semiconductor inspection apparatus according to the present invention uses the probe cassette described in (1) above, and it comprises: the probe cassette; a tester which is connected to the connection terminals for a tester of the probe cassette and inspects electrical characteristics of a semiconductor device mounted in the probe cassette; and a vacuum degree control system which reduces pressure in a space between the probe sheet and the supporting member of the probe cassette and controls a load applied between electrodes of the semiconductor device and the contact terminals of the probe sheet.

(4) Another semiconductor inspection apparatus according to the present invention uses the probe cassette described in (2) above, and it comprises: the probe cassette; a tester which is connected to the connection terminals for a tester of the probe cassette and inspects electrical characteristics of a semiconductor device mounted in the probe cassette; and a vacuum degree control system which reduces pressure in a space between the second probe sheet and the supporting member of the probe cassette and controls a load applied between electrodes of the semiconductor device and the contact terminals of the first probe sheet.

(5) Still another semiconductor inspection apparatus according to the present invention uses the probe cassette described in (2) above, and it comprises: the probe cassette; a tester which is connected to the connection terminals for a tester of the probe cassette and inspects electrical characteristics of a semiconductor device mounted in the probe cassette; and a vacuum degree control system which reduces pressure in a space between the first probe sheet and the supporting member of the probe cassette and a space between the second probe sheet and the supporting member of the probe cassette and controls a load applied between electrodes of the semiconductor device and the contact terminals of the first probe sheet.

(6) A first manufacturing method of a semiconductor device according to the present invention comprises: a step of creating circuits on a wafer to form a plurality of semiconductor devices; a step of collectively inspecting electrical characteristics of the plurality of semiconductor devices in a state of the wafer; a step of cutting the wafer and separating it into respective semiconductor devices; and a step of sealing the semiconductor devices with resin, wherein the step of inspecting electrical characteristics uses the semiconductor inspection apparatus described in (3), (4) or (5) above.

(7) A second manufacturing method of a semiconductor device according to the present invention comprises: a step of creating circuits on a wafer to form a plurality of semiconductor devices; a step of collectively inspecting electrical characteristics of the plurality of semiconductor devices in a state of the wafer; and a step of cutting the wafer and separating it into respective semiconductor devices, wherein the step of inspecting electrical characteristics uses the semiconductor inspection apparatus described in (3), (4) or (5) above.

(8) A third manufacturing method of a semiconductor device according to the present invention comprises: a step of creating circuits on a wafer to form a plurality of semiconductor devices; and a step of collectively inspecting electrical characteristics of the plurality of semiconductor devices in a state of the wafer, wherein the step of inspecting electrical characteristics uses the semiconductor inspection apparatus described in (3), (4) or (5) above.

(9) A fourth manufacturing method of a semiconductor device according to the present invention comprises: a step of creating circuits on a wafer to form a plurality of semiconductor devices; a step of sealing the wafer with resin; and a step of collectively inspecting electrical characteristics of the plurality of semiconductor devices formed in the sealed wafer, wherein the step of inspecting electrical characteristics uses the semiconductor inspection apparatus described in (3), (4) or (5) above.

(10) A fifth manufacturing method of a semiconductor device according to the present invention comprises: a step of creating circuits on a wafer to form a plurality of semiconductor devices; a step of dividing the wafer into a plurality of wafers; and a step of collectively inspecting electrical characteristics of the plurality of semiconductor devices formed in the divided wafers, wherein the step of inspecting electrical characteristics uses the semiconductor inspection apparatus described in (3), (4) or (5) above.

(11) A sixth manufacturing method of a semiconductor device according to the present invention comprises: a step of creating circuits on a wafer to form a plurality of semiconductor devices; and a step of inspecting electrical characteristics of the plurality of semiconductor devices arranged alternately in a state of the wafer and repeating the same to inspect all the semiconductor devices created on the wafer, wherein the step of inspecting electrical characteristics uses the semiconductor inspection apparatus described in (3), (4) or (5) above.

EFFECT OF THE INVENTION

The effects obtained by typical aspects of the present invention will be briefly described below.

(1) It is possible to provide an inspection apparatus in which the positional accuracy of the tips of the contact terminals can be ensured, and thus, the semiconductor elements having numerous electrodes for inspection or electrodes distributed over a large area with narrow pitches can be reliably inspected.

(2) It is possible to provide a structure in which electronic components for inspection circuits can be mounted in the vicinity of the contact terminals and a manufacturing method of a semiconductor device capable of improving the electrical characteristics and reliability by securing the good connection to the electrodes.

(3) It is possible to provide a manufacturing method of a semiconductor device capable of reducing the overall production cost of semiconductor devices by improving assembly property of probe sheet having contact terminals formed thereon, simplifying procedures and works of inspection process, and reducing assembly costs of inspection apparatus to reduce the costs of the inspection process of semiconductor devices.

(4) It is possible to provide a manufacturing method of a semiconductor device in which, since there is only one probing mark on the electrode of the semiconductor device formed in all the electric inspection processes, the reliability of the subsequent bonding process of a semiconductor device can be improved.

BRIEF DESCRIPTIONS OF THE DRAWINGS

FIG. 8G to FIG. 8I are cross sectional views showing the sequential manufacturing processes (subsequent to FIG. 7) of a probe sheet on which wires are formed, in a probe cassette according to the present invention;

Figure 14A:
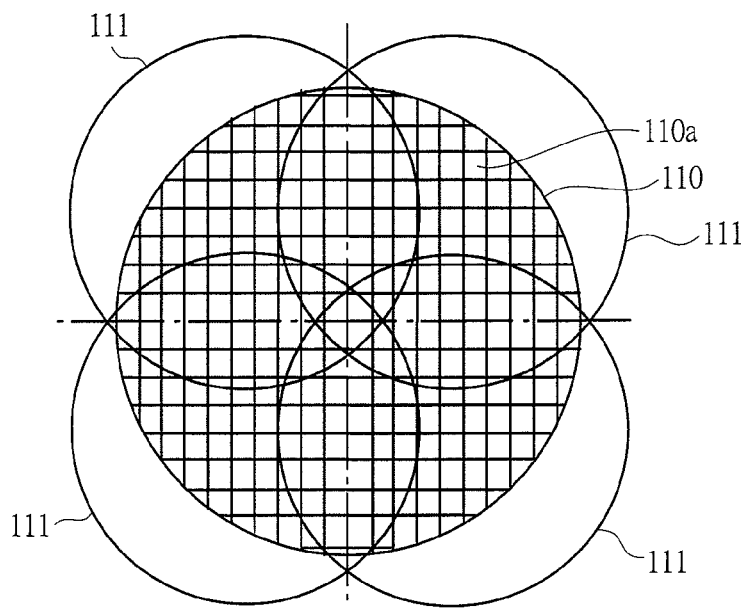
Figure 14B:
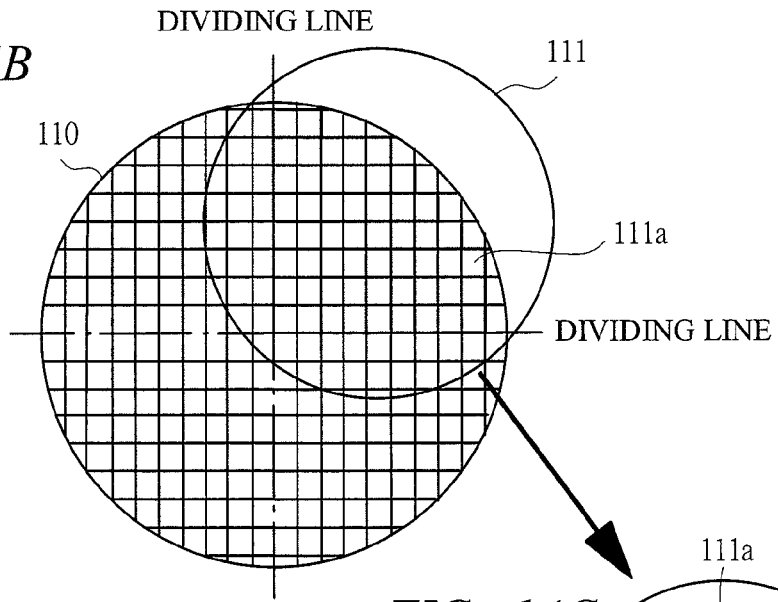
Figure 14C:
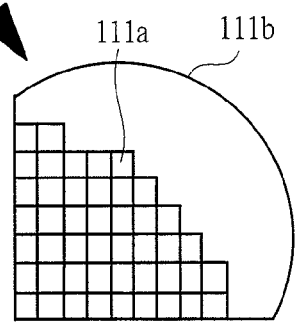
Figure 14D:
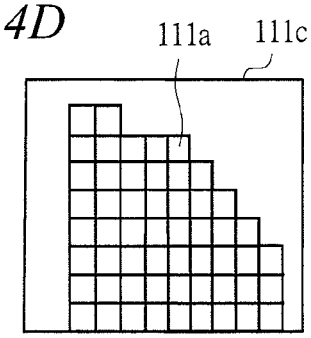
Figure 15:
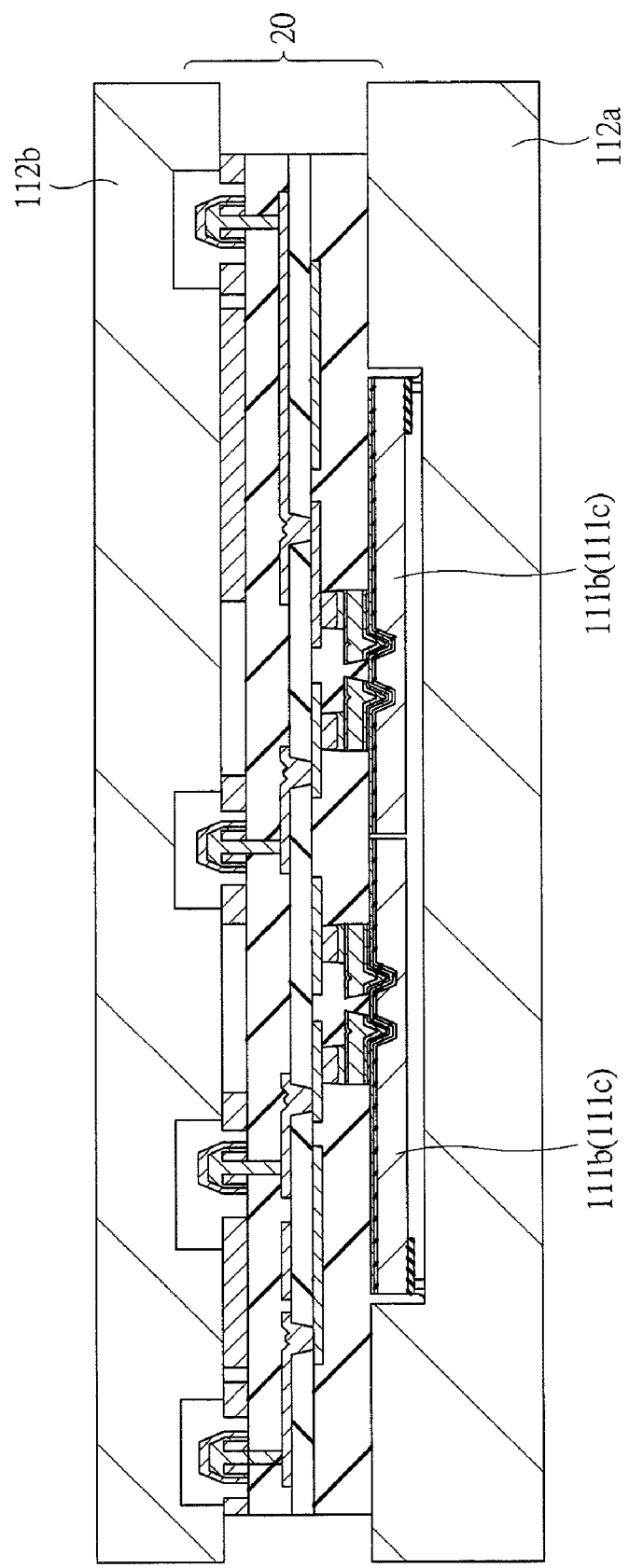
Figure 16:
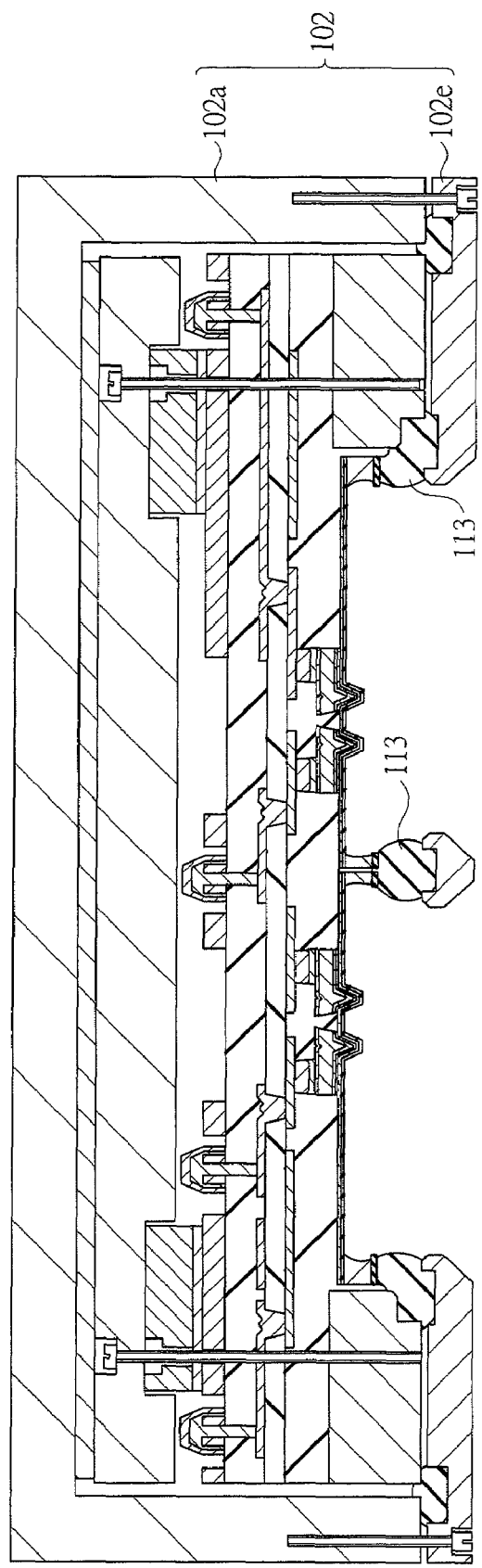
Figure 17:
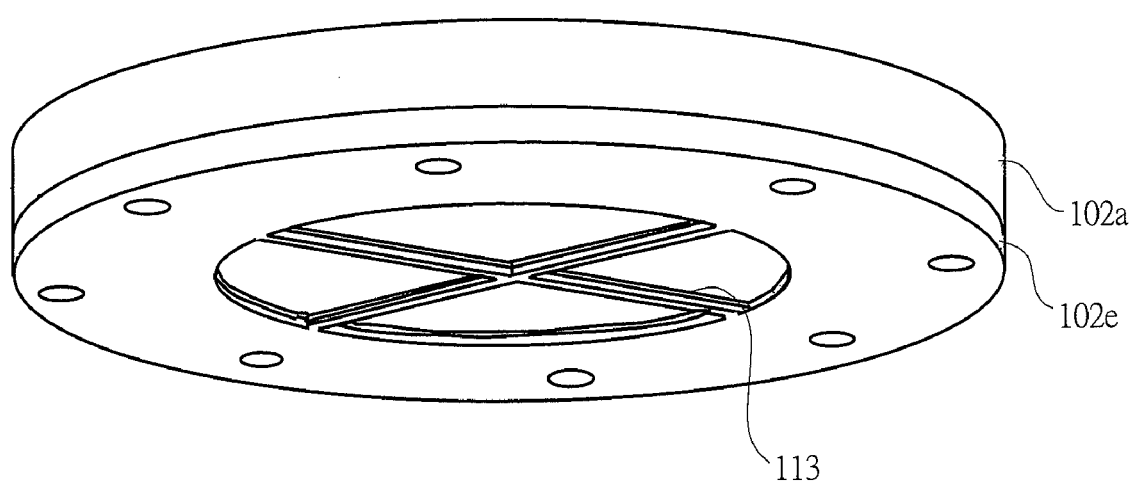
Figure 18A:
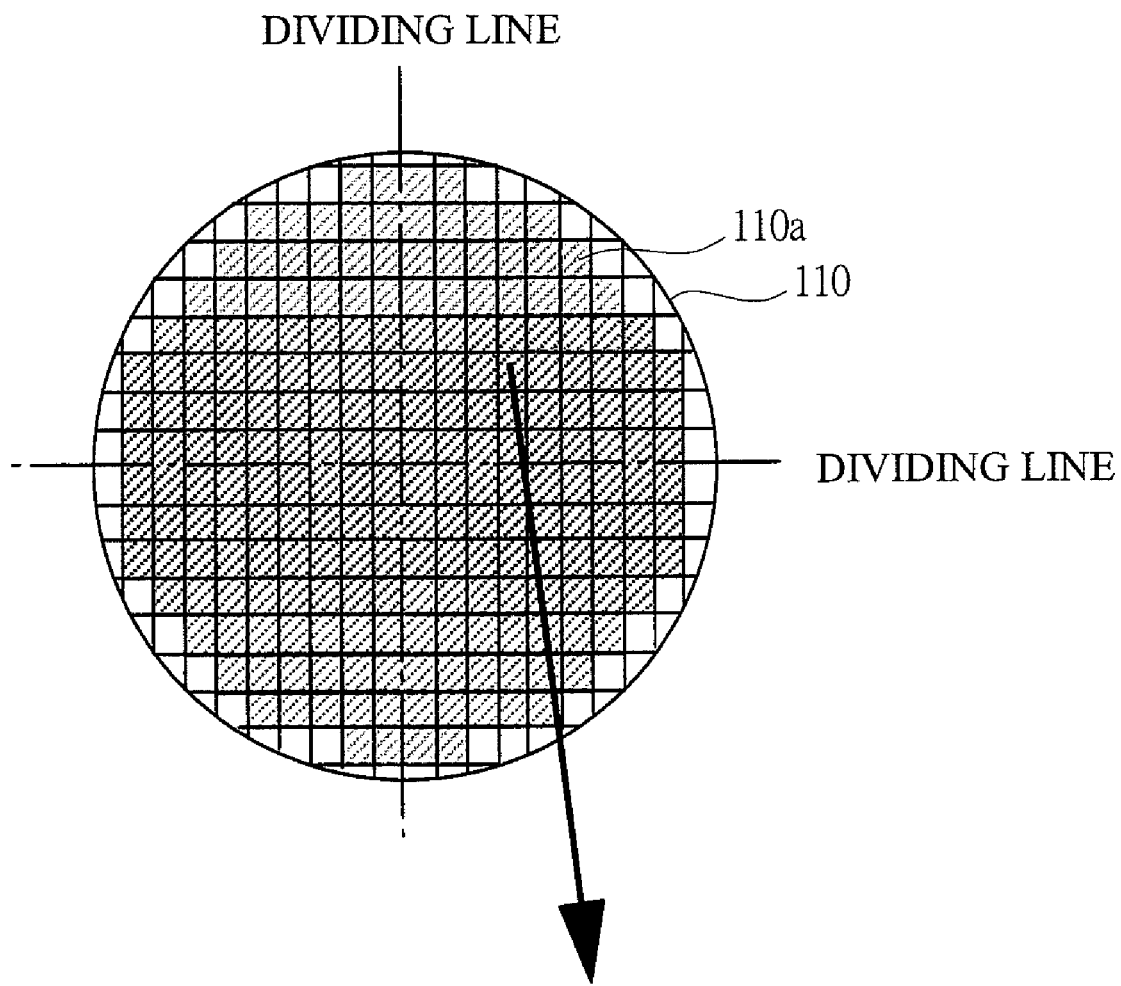
Figure 18B:
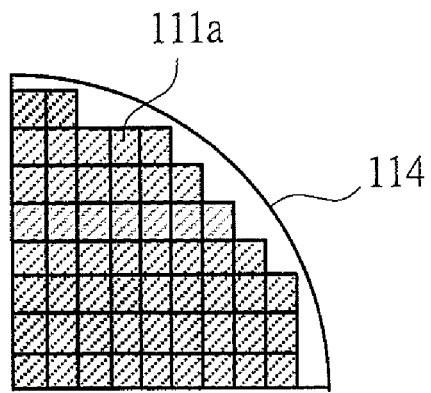
Figure 19A:
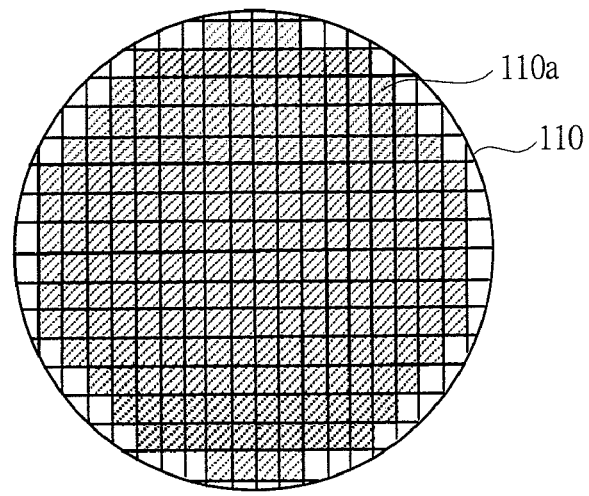
Figure 19B:
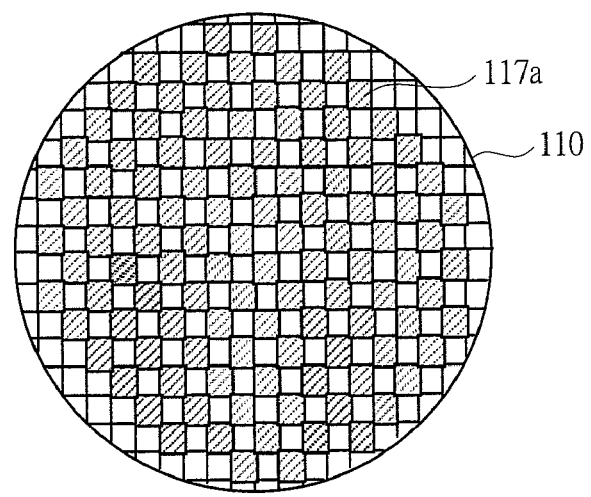
Figure 19C:
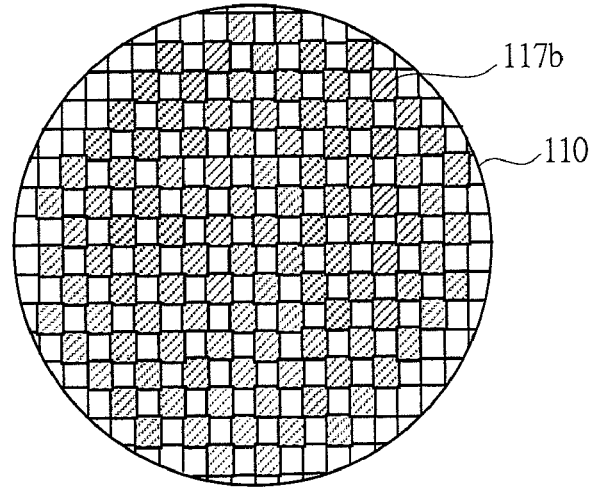
Figure 20:
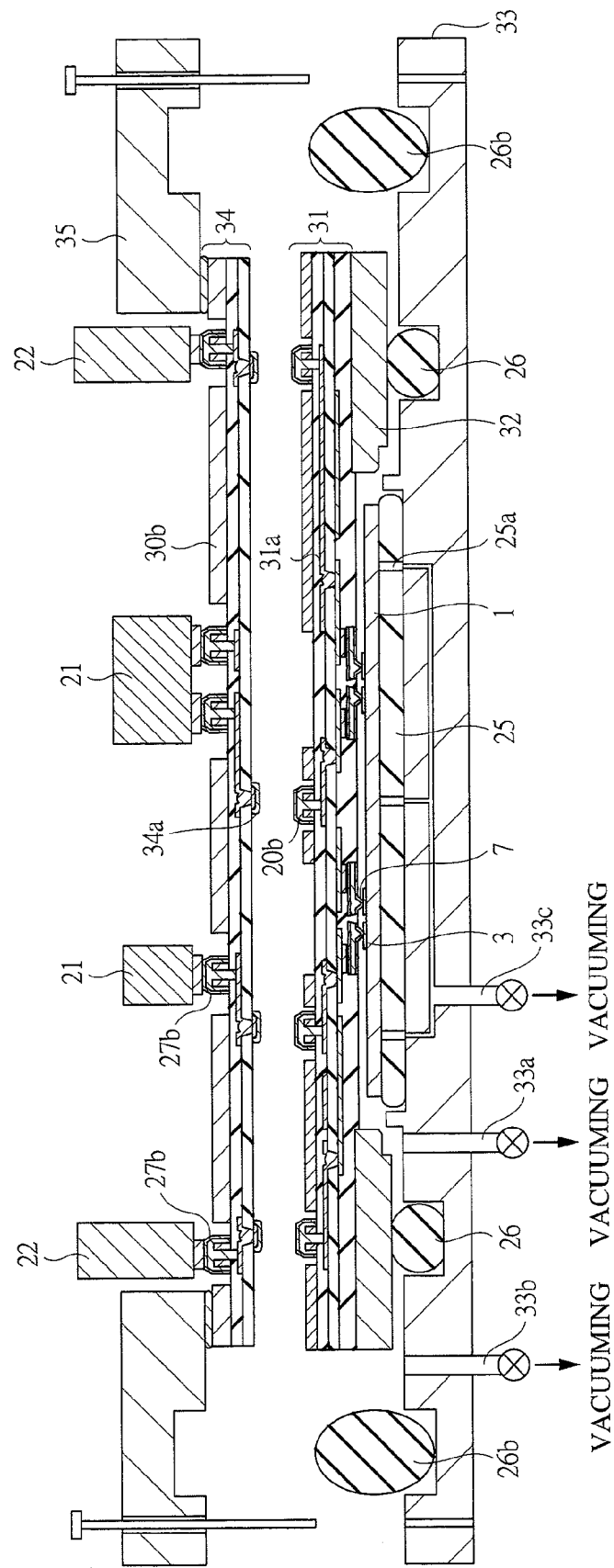
Figure 21:
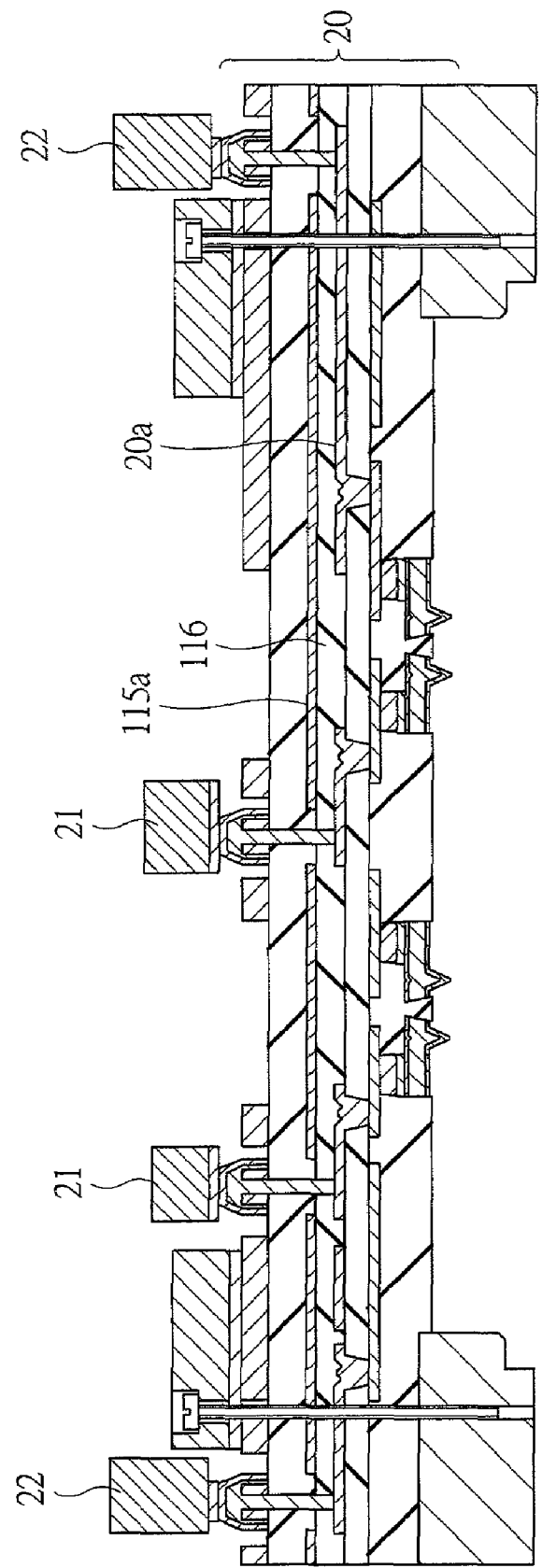
Figure 22:
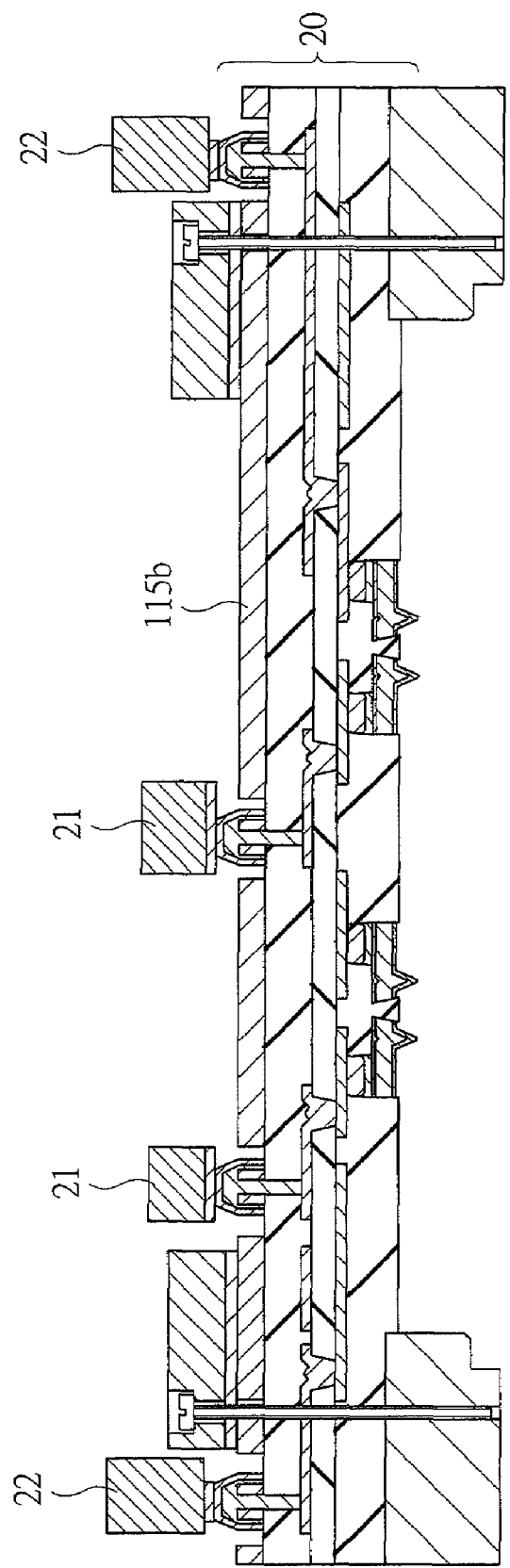
Figure 23:
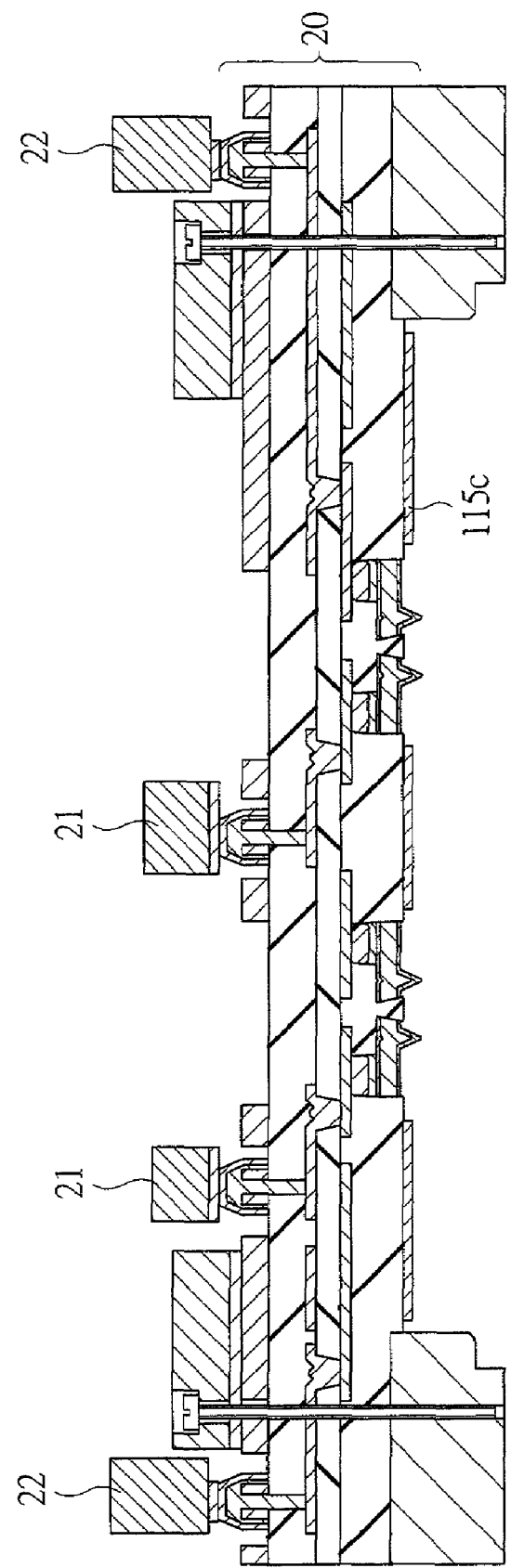
Figure 24:
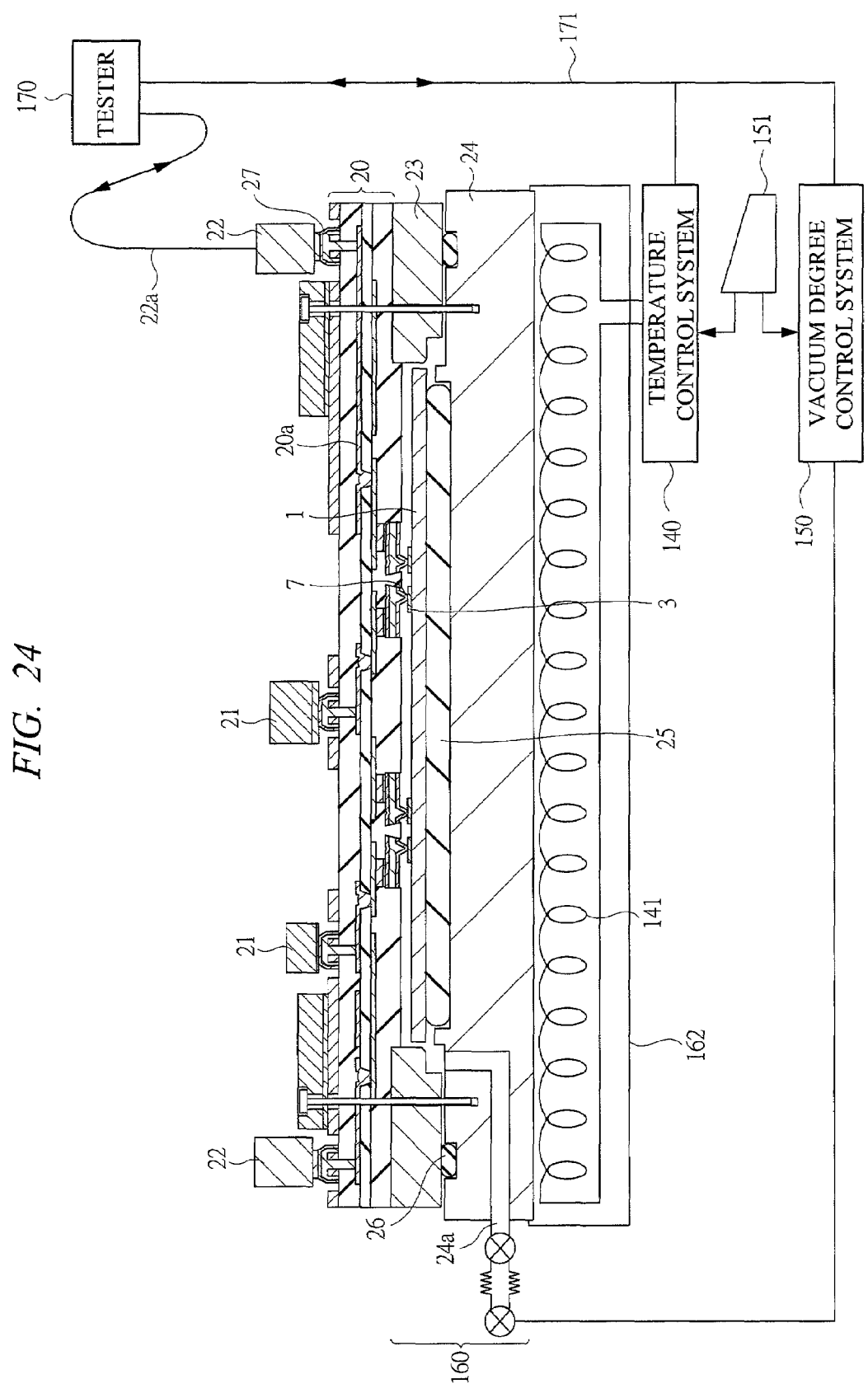
Figure 25:
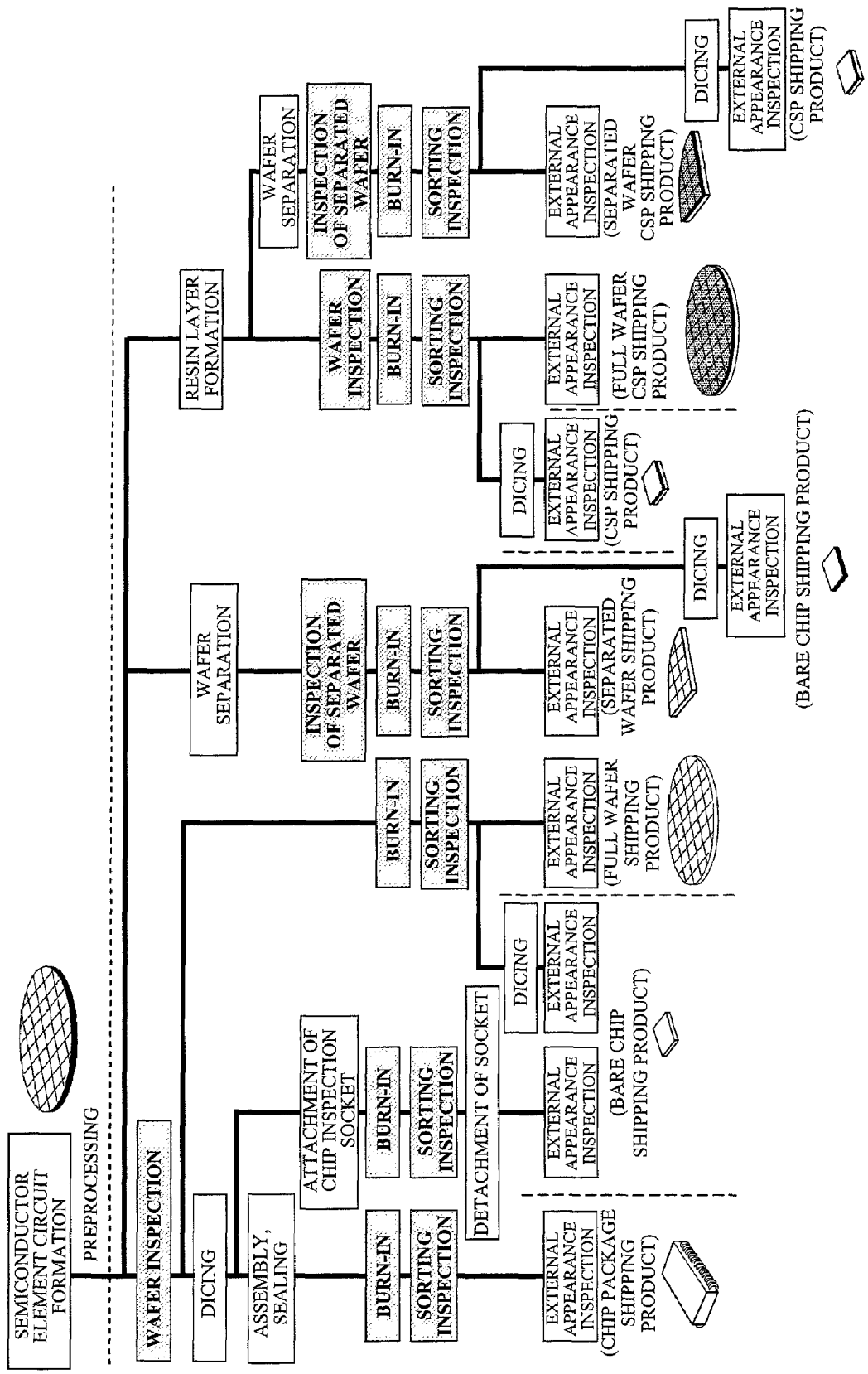

FIG. 14A is a plan view showing an example where the semiconductor element formation area of a wafer to be inspected is covered by four small wafers, FIG. 14B is a plan view showing an example where ¼ area of the semiconductor element formation area of a wafer to be inspected is formed on a small wafer, and FIG. 14C and FIG. 14D are plan views showing representative examples where the wafer of FIG. 14B is cut;

FIG. 15 is a cross sectional view showing the sequential manufacturing processes for forming a probe sheet from a plurality of wafers in a probe cassette according to the present invention;

FIG. 16 is a cross sectional view showing the sequential manufacturing processes (subsequent to FIG. 15) for forming a probe sheet from a plurality of wafers in a probe cassette according to the present invention;

FIG. 17 is a perspective view showing a lower side of a silicon etching jig of FIG. 16 in the manufacturing processes for forming a probe sheet from a plurality of wafers in a probe cassette according to the present invention;

FIG. 18A is a plan view showing an example of the semiconductor element formation area of a wafer to be inspected, and FIG. 18B is a plan view showing a wafer obtained by dividing the wafer to be inspected into four pieces and the semiconductor element formation area thereof;

FIG. 19A is a plan view showing an example of the semiconductor element formation area of a wafer to be inspected, FIG. 19B is a plan view showing an example of a wafer on which semiconductor elements are alternately arranged in the case where the inspection of a wafer to be inspected is separately performed a plurality of times, and FIG. 19C is a plan view showing an example of a wafer to be paired with that in FIG. 19B, on which semiconductor elements are alternately arranged in the case where the inspection of a wafer to be inspected is separately performed a plurality of times;

FIG. 20 is a cross sectional view showing the principal part of a probe cassette according to a third embodiment of the present invention;

FIG. 21 is a cross sectional view showing a probe sheet in which a ground layer is formed, in a probe cassette according to the present invention;

FIG. 22 is a cross sectional view showing another probe sheet in which a ground layer is formed, in a probe cassette according to the present invention;

FIG. 23 is a cross sectional view showing another probe sheet in which a ground layer is formed, in a probe cassette according to the present invention;

FIG. 24 is a diagram showing the entire schematic structure of an inspection system according to an embodiment of the present invention; and FIG. 25 is a diagram showing the representative example of the manufacturing processes including the inspection process of a semiconductor device according to an embodiment of the present invention.

BEST MODE FOR CARRYING OUT THE INVENTION

Hereinafter, embodiments of the present invention will be described in detail with reference to the accompanying drawings. Note that components having the same function are denoted by the same reference symbols throughout the drawings for describing the embodiment, and the repetitive description thereof will be omitted.

In the embodiments of the present invention, main terms are defined respectively as shown below.

Figures 1A, 1B:
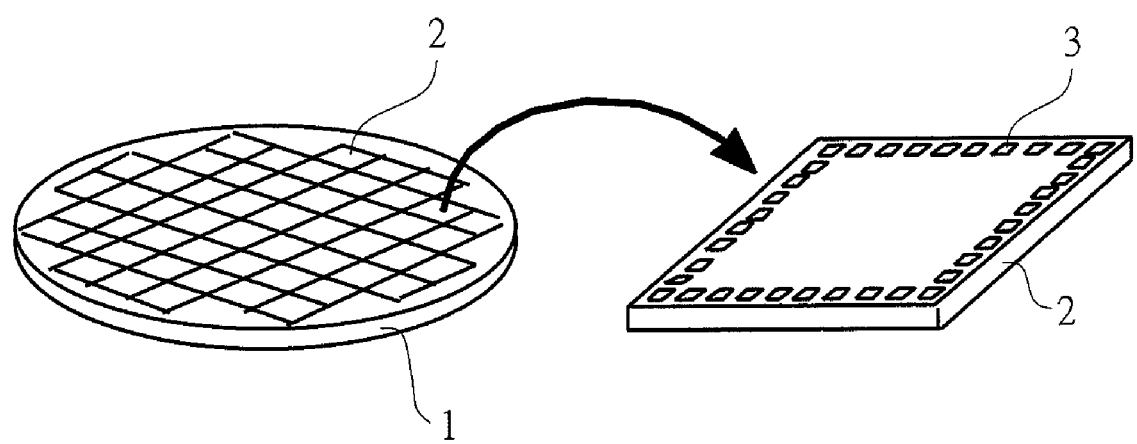
FIG. 1A is a perspective view showing a wafer to be inspected on which semiconductor elements (chips) are arranged according to the present invention.
FIG. 1B is a perspective view showing a semiconductor element (chip)

A semiconductor device may be, irrespective of its configuration, the one in a wafer state on which circuits are formed (for example, the wafer 1 in FIG. 1A), an individual semiconductor element cut from a wafer (for example, the chip (semiconductor device) 2 in FIG. 1B), the one obtained by dividing a wafer into a plurality of pieces, the one packaged in a wafer state (wafer level CSP), the one obtained by dividing the one packaged in a wafer state into a plurality of pieces, and the one obtained by cutting the one packaged in a wafer state from a wafer to be an individual semiconductor element (CSP). Note that FIG. 1 shows an example of a target to be inspected, and the arrangement of the electrodes 3 may be either a peripheral electrode arrangement or a full grid electrode arrangement.

A probe sheet indicates a sheet having contact terminals which come into contact with electrodes of a target to be inspected and wirings led from the contact terminals or a sheet in which lead wirings are formed between electrodes of both surfaces.

A probe cassette indicates a structure having a function to establish the connection with an electrode of a target to be inspected so as to electrically connect a tester serving as a measurement device with the target to be inspected (for example, a structure shown in FIG. 2, FIG. 3, or FIG. 4 described later).

First, the structure of a probe cassette according to a first embodiment of the present invention will be described with reference to FIG. 2 and FIG. 3. FIG. 2 is a cross sectional view showing the principal part of a probe cassette according to the first embodiment of the present invention, and FIG. 3 is a perspective view showing the principle parts thereof in an exploded manner.

The probe cassette according to the first embodiment includes a plurality of contact terminals 7 in contact with electrodes 3 of a wafer 1, lead wires 20a led out from the respective contact terminals 7, and a plurality of peripheral electrodes 27 electrically connected to the lead wires 20a, and it is composed of a probe sheet 20 on which mounting parts 21 for inspection circuit and connectors 22 for external wire connection are connected to the peripheral electrodes 27, upper supporting members 23 that adhere and fix this probe sheet 20, a lower supporting member 24, a buffer material 25 and O-rings 26 interposed between the upper supporting members 23 and the lower supporting member 24, and others.

In this probe cassette, the wafer 1 is interposed together with the buffer material 25 and the O-rings 26 between the upper supporting members 23 that adhere and fix the probe sheet 20 on which the mounting parts 21 for inspection circuit and the connectors 22 for external wire connection are connected and the lower supporting member 24, and the contact terminals 7 formed on the surface of the probe sheet 20 disposed to oppose the electrodes 3 for inspection formed on the surface of the wafer 1 are brought into contact with the electrodes 3 with a desired atmospheric pressure by reducing the pressure through the vacuuming from a vacuuming port 24a provided in the lower supporting member 24.

Herein, a metal film 30 is formed on the probe sheet 20 so as to avoid the mounting parts 21 and the connectors 22 and surround the group of the contact terminals 7. By this means, it is possible to realize a structure where the positional accuracy of the contact terminals can be secured and the probe sheet area having no metal film 30 and having flexibility of the contact terminals can follow a fine inclination of the wafer surface of the contact target, while maintaining the portion backed by the metal film 30. More specifically, since the plurality of contact terminals 7 are surrounded and backed by the metal film 30, it is possible to prevent unnecessary stress from being applied to the area where the contact terminals 7 are formed in the inspection operation and possible to realize the accurate contact with high positional accuracy between the wafer 1 and the electrodes 3. In addition, the metal film 30 can be regarded almost the same as the wafer 1 by using a material having almost the same linear expansion ratio as silicon wafer such as 42 alloy or invar, and it is possible to secure the positional accuracy of the tips of the contact terminals 7 arranged in a large area even at a high temperature.

Further, by forming the metal film 30, the strength of the probe sheet 20 can be secured, the positional accuracy of the peripheral electrodes 27 rewired via the lead wires 20a from the contact terminals 7 can be secured, and handling at the assembly process can be facilitated. In addition, by forming holes 28 having high positional accuracy and precise shape used to the positioning and the insertion of screws in the metal film 30 through the bulk etching process using a photomask, it is possible to facilitate the positioning at the assembly process.

Next, the structure of a probe cassette according to a second embodiment of the present invention will be described with reference to FIG. 4. FIG. 4 is a cross sectional view showing the principal part of a probe cassette according to the second embodiment of the present invention.

In the probe cassette according to the second embodiment, the difference from the first embodiment lies in that it is formed of two probe sheets (rewire sheet) 31 and a probe sheet (part mounting sheet) 34. The probe sheet 31 includes a plurality of contact terminals 7 in contact with the electrodes 3 of the wafer 1 and a plurality of contact bumps 20b electrically connected to the respective contact terminals 7 via the lead wires 31a. The probe sheet 34 includes a plurality of contact electrodes 34a in contact with the contact bumps 20b of the probe sheet 31 and a plurality of peripheral electrodes 27b electrically connected to the respective contact electrodes 34a. Further, the probe sheet 34 is backed by a metal film 30b.

More specifically, the probe cassette according to the second embodiment is composed of a probe sheet 31 on which contact bumps 20b which expand and rewire the arrangement of the contact terminals 7 into arbitrary arrangement through lead wires 31a are formed, an intermediate supporting member 32 that adheres and fixes this probe sheet 31, a lower supporting member 33, a buffer material 25 and O-rings 26 interposed between the intermediate supporting member 32 and the lower supporting member 33, a probe sheet 34 to which the mounting parts 21 for inspection circuit and the connectors 22 for external wire connection are connected, uppermost supporting members 35 that adhere and fix this probe sheet 34, and O-rings 26b interposed between the uppermost supporting members 35 and the lower supporting member 33.

In this probe cassette, a wafer 1 is interposed together with the buffer material 25 and the O-rings 26 between the intermediate supporting member 32 that adheres and fixes the probe sheet 31 on which the contact bumps 20b which rewire and expand the arrangement of the contact terminals 7 into an arbitrary arrangement are formed and the lower supporting member 33, and the contact terminals 7 formed on the surface of the probe sheet 31 arranged to oppose the electrodes 3 for inspection formed on the surface of the wafer 1 are brought into contact with the electrodes 3 with a desired atmospheric pressure by reducing the pressure through the vacuuming from a vacuuming port 33a provided in the lower supporting member 33.

Subsequently, the O-rings 26b are interposed between the lower supporting member 33 in which the wafer 1 is interposed between the probe sheet 31 adhered and fixed to the intermediate supporting member 32 and the lower supporting member 33 and is fixed by the vacuuming and the uppermost supporting members 35 to which the probe sheet 34 on which the mounting parts 21 for inspection circuit and the connectors 22 for external wire connection is adhered and fixed. Then, by reducing the pressure through the vacuuming from the vacuuming port 33a provided in the lower supporting member 33, the contact electrodes 34a formed on the surface of the probe sheet 34 disposed so as to oppose the contact bumps 20b which rewire the arrangement of the contact terminals 7 are contacted with a desired atmospheric pressure.

Next, with regard to an example of the probe sheet (structure) used in the probe cassette according to the first embodiment, the manufacturing method thereof will be described with reference to FIG. 5 to FIG. 11.

Figure 2:
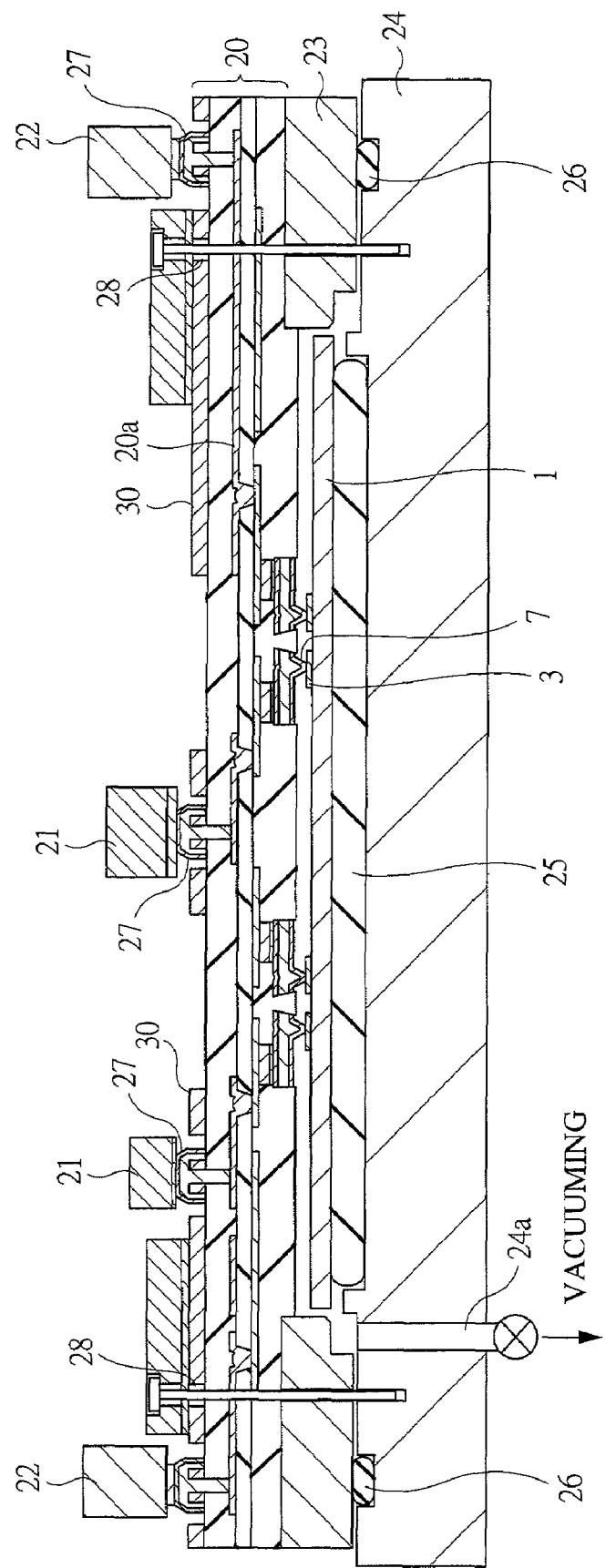
FIG. 2 is a cross sectional view showing the principal part of a probe cassette according to a first embodiment of the present invention.
Figure 3:
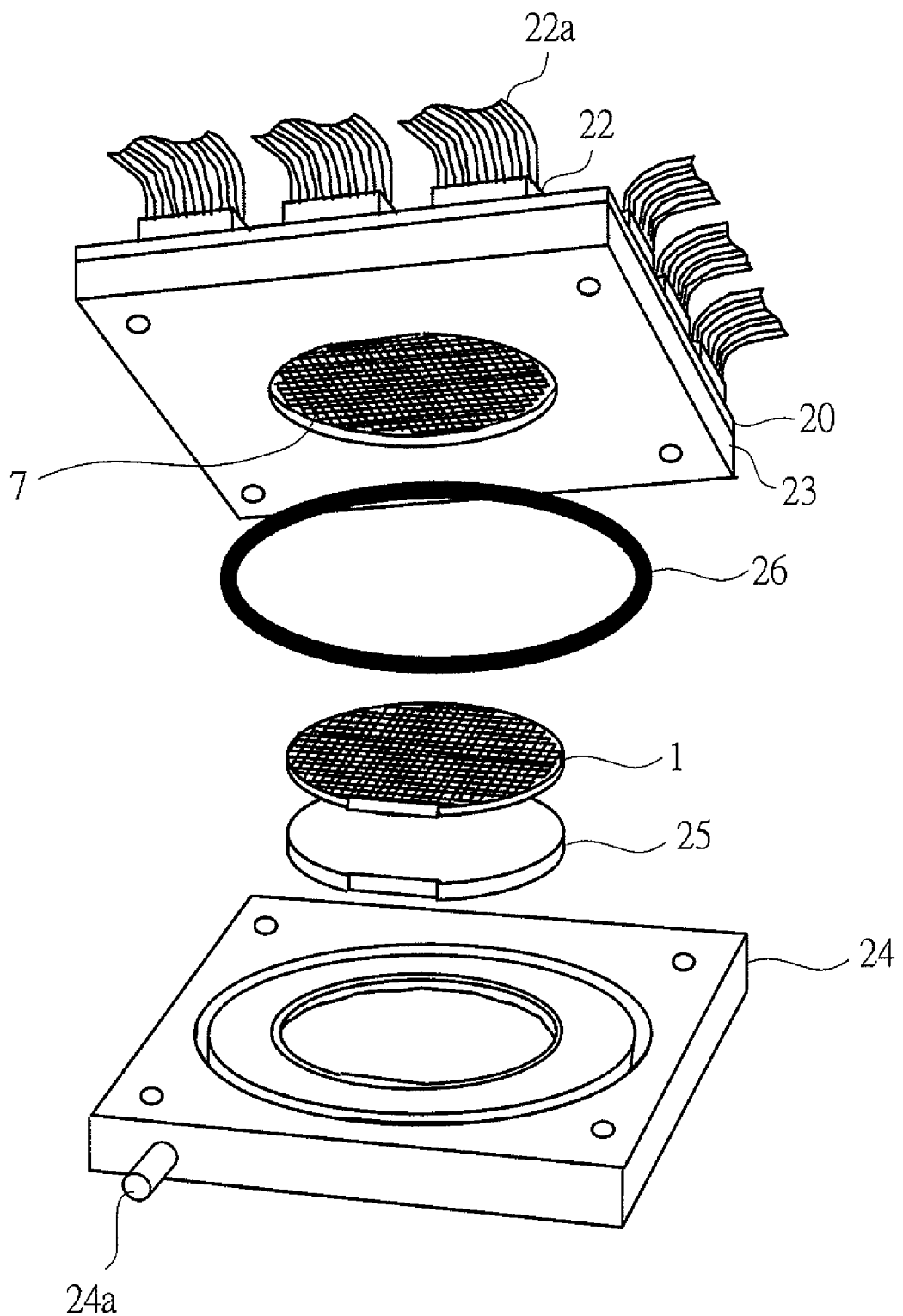
FIG. 3 is a perspective view showing main parts of FIG. 2 in an exploded manner in a probe cassette according to a first embodiment of the present invention.

FIG. 5 to FIG. 11 show respective processes in the manufacturing process for forming the probe cassette shown in FIG. 2, in which a silicon wafer 80 on which tip portions of contact terminals with a truncated pyramidal shape are formed with using truncated pyramidal holes formed by the anisotropic etching to the silicon wafer 80 as casts and a polyimide film on which wires and connection vias are formed and which is backed by the metal film 30 are bonded by pressurizing and heating them together with a polyimide-based adhesive layer in vacuum so that the tip portions of the contact terminals and the connection vias are opposed to each other, thereby forming an assembled probe sheet 20.

Figure 5A:
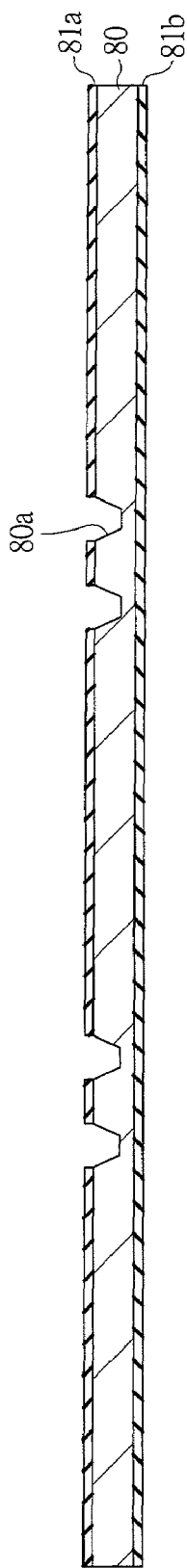
FIG. 5A to FIG. 5C are cross sectional views showing the sequential manufacturing processes for forming the contact terminal portions in a probe sheet of a probe cassette according to the present invention.

First, the process shown in FIG. 5A is carried out. In this process, after silicon dioxide films 81a and 81b with a thickness of about 0.5 µm are formed by thermal oxidation on both the surfaces of a (100) silicon wafer 80 with a thickness of 0.2 to 0.6 mm, photoresist is applied and a pattern in which the photoresist at the positions where the truncated pyramidal holes are to be formed is removed by photolithography process is formed. Thereafter, with using this photoresist as a mask, the silicon dioxide film 81a is etched and removed by mixed solution of hydrofluoric acid and ammonium fluoride. Then, with using the silicon dioxide film 81a as a mask, the silicon wafer 80 is anisotropically etched by strong alkali solution (for example, potassium hydroxide), thereby forming truncated pyramidal etching holes 80a surrounded by (111) side surfaces.

In this case, the silicon wafer 80 is used as a base member. However, it is needless to mention that any material may be employed as the base member as long as it has crystalline property and it can be modified and altered within the scope of the invention. Further, the holes formed by anisotropic etching are designed to have a truncated pyramidal shape. However, it may be a pyramidal shape and other shape may be employed as long as it can form the contact terminals 7 which can secure stable contact resistance with a small needle pressure. Further, it is needless to mention that a plurality of contact terminals can contact the electrode to be contacted.

Figure 5B:
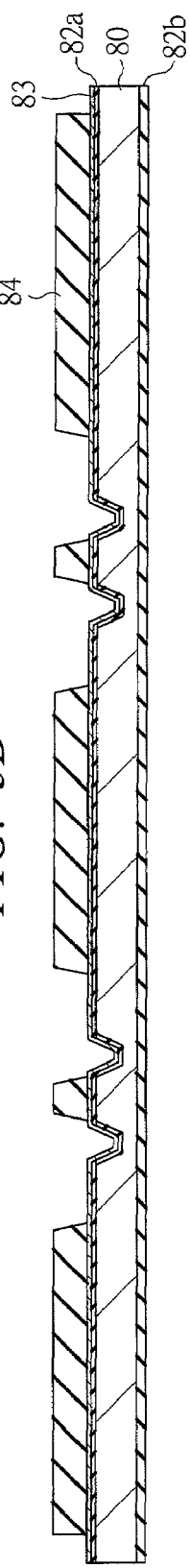

Subsequently, the process shown in FIG. 5B is carried out. In this process, the silicon dioxide film 81a used as the mask is etched and removed by mixed solution of hydrofluoric acid and ammonium fluoride, and silicon dioxide films 82a and 82b are formed to have a thickness of about 0.5 μm on the entire surface of the silicon wafer 80 once again by thermal oxidation in wet oxygen. Then, a conductive coating 83 is formed on the surface thereof, a dry film 84 is formed on the surface of the conductive coating 83, and then, the dry film 84 at the positions where the contact terminals 7 and the connection electrode portions 7b are to be formed is removed. Although the dry film 84 is used in this case, liquid resist or film resist can be used as the photoresist mask so long as it is a film having photosensitivity.

As the conductive coating 83, for example, a chromium film is formed to have a thickness of about 0.1 μm by sputtering method or deposition method, and a copper film is formed to have a thickness of about 1 μm on the surface of this chromium film by sputtering method or deposition method.

Figure 5C:
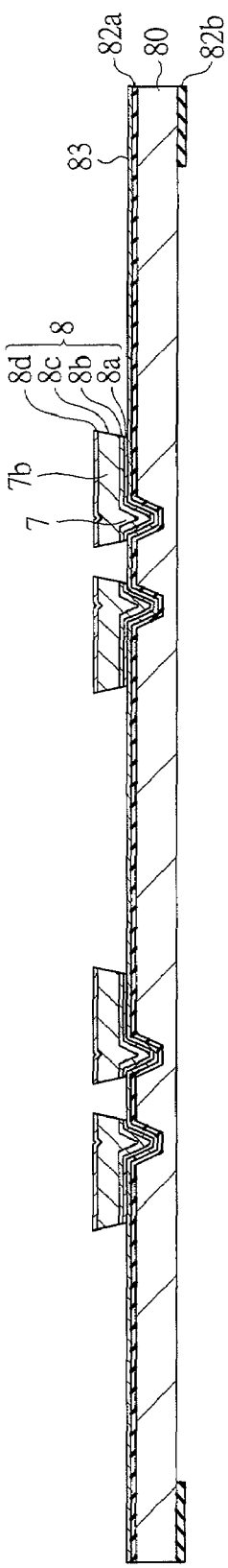

Subsequently, the process shown in FIG. 5C is carried out. First, electric plating using a material with high hardness as a main component is performed to the conductive coating 83 exposed at the opening portions of the dry film 84 with using this conductive coating 83 as an electrode, thereby forming contact terminal portions 8 in which the contact terminal 7 and connection electrode portion 7b are integrated. As a plating material, for example, nickel 8a, rhodium 8b, nickel 8c, and gold 8d are sequentially plated to form the contact terminal portion 8.

Thereafter, the silicon dioxide film 82b on the opposite surface of the surface where the contact terminals 7 of the silicon wafer 80 are formed is etched and removed by mixed solution of hydrofluoric acid and ammonium fluoride, and the dry film 84 is removed.

On the other hand, separately from the process described above, the process shown in FIG. 6A is carried out. In this process, photoresist is applied to a copper film 85a of one surface of a polyimide film 86 having copper films 85a and 85b formed on both surfaces thereof, and a pattern in which photoresist at the positions where vias 87 are to be formed is removed by photolithography process is formed. Thereafter, with using this photoresist as a mask, the copper film at positions where the vias are to be formed is etched and removed by alkali copper etching solution, and then, the photoresist is removed.

Figure 6A:
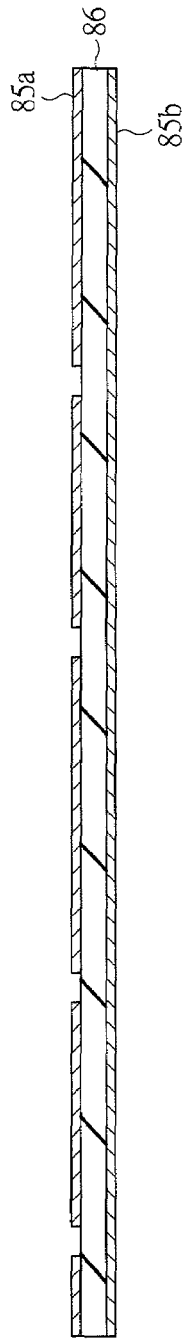
FIG. 6A to FIG. 6C are cross sectional views showing the sequential manufacturing processes of a probe sheet on which wires are formed, in a probe cassette according to the present invention.
Figure 6B:
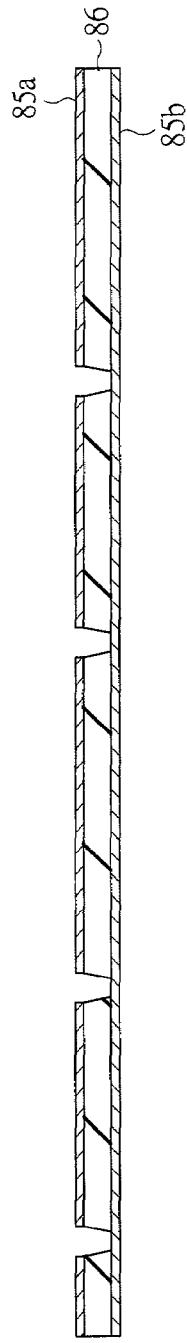

Subsequently, the process shown in FIG. 6B is carried out. In this process, holes for forming the vias are formed in the polyimide film 86 with using the copper film 85a as a mask. As a method for forming the holes, for example, the polyimide film 86 is removed by laser or dry etching with using the copper film 85a as a mask.

Figure 6C:
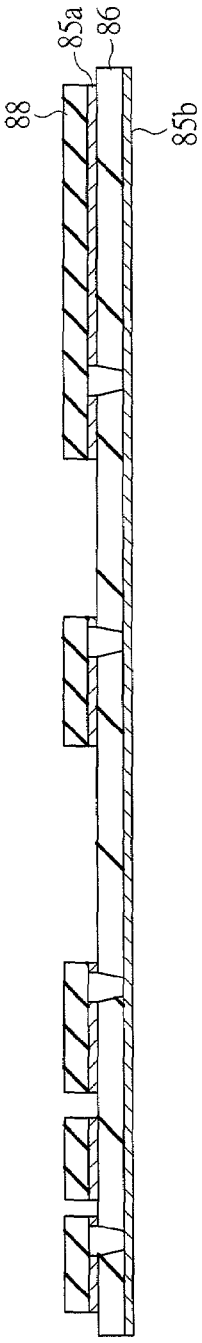

Thereafter, the process shown in FIG. 6C is carried out. In this process, a dry film 88 is applied onto the copper film 85a of the polyimide film 86, and a pattern in which the dry film 88 other than the positions where the wires 20a are to be formed is removed by photolithography process is formed. Thereafter, the copper film is etched and removed by alkali copper etching solution with using this dry film 88 as a mask.

Figure 7D:
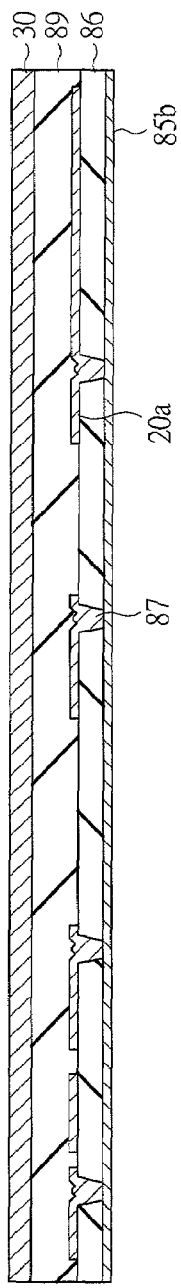
FIG. 7D to FIG. 7F are cross sectional views showing the sequential manufacturing processes (subsequent to FIG. 6) of a probe sheet on which wires are formed, in a probe cassette according to the present invention.

Thereafter, the process shown in FIG. 7D is carried out. In this process, the dry film 88 is removed and the copper film 85b is plated with copper as power source layer, thereby filling the holes for forming the vias with copper. Thereafter, an adhesive layer 89 and the metal film 30 are adhered.

Herein, as the adhesive layer 89, for example, a polyimide-based adhesive sheet or an epoxy-based adhesive sheet may be employed. Further, as the metal film 30, a metal sheet with a low linear expansion ratio like that of 42 alloy (alloy of nickel 42% and iron 58% with a linear expansion of 4 ppm/° C.) or invar (for example, alloy of nickel 36% and iron 64% with a linear expansion ratio of 1.5 ppm/° C.) and a linear expansion ratio close to that of a silicon wafer (silicon base member) 80 is adhered to the polyimide film 86 where wires 20a are formed by the adhesive layer 89. By this means, it is possible to improve the strength of the probe sheet to be formed, attain a large area, and prevent positional displacement due to temperature at the time of inspection. Further, it is also possible to secure the positional accuracy under various conditions. In this sense, for the purpose of securing the positional accuracy at the burn-in inspection, a material with a linear expansion ratio close to that of a semiconductor element to be inspected may be employed as the metal film 30.

In the adhesion process described above, for example, the polyimide film 86 on which the vias 87 and the wires 20a are formed, the adhesive layer 89 and the metal film 30 are overlapped. In this state, they are heated to the temperature of the glass transition point (Tg) of the adhesive layer 89 or more while applying the pressure of 10 to 200 Kgf/cm$^2$, thereby adhering them in vacuum.

Figure 7E:
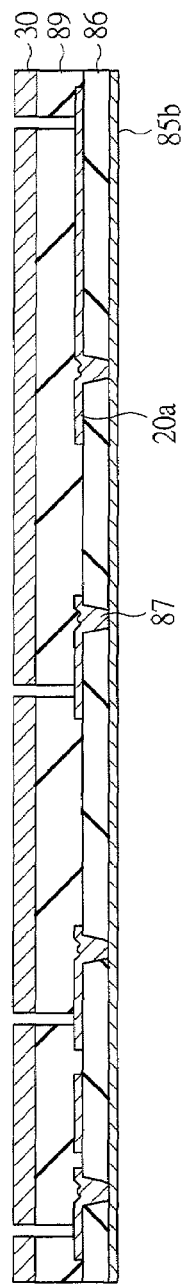

Subsequently, the process shown in FIG. 7E is carried out. In this process, photoresist is applied onto the metal film 30, and a pattern in which photoresist at the positions where the vias 90 are to be formed is removed by photolithography process is formed. Thereafter, the metal film at positions where the vias are to be formed is etched and removed with using this photoresist as a mask, and then, the photoresist is removed. Then, holes for forming the vias are formed in the adhesive layer 89 with using the metal film 30 as a mask. For example, in the case where 42 alloy or invar is used as the metal film 30, the metal film at the positions where the vias are to be formed is etched and removed by ferric chloride solution. As a method of forming the holes, for example, the adhesive layer 89 is removed by laser or dry etching.

Figure 7F:
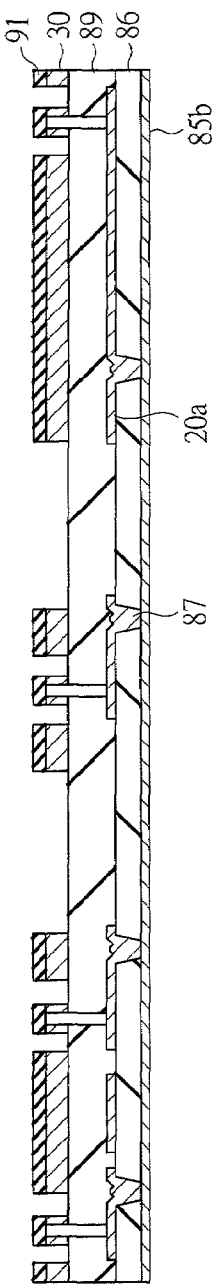

Subsequently, the process shown in FIG. 7F is carried out. In this process, a dry film 91 is formed on the surface of the metal film 30, and the dry film 91 at the position where the metal film 30 is to be removed is removed by exposure and development. Thereafter, the metal film 30 is etched and removed. Although the dry film 91 is used in this case, any other film can be used as long as it is a film having photosensitivity.

For example, in the case where 42 alloy or invar is used as the metal film 30, the metal film can be removed by the shower etching using ferric chloride solution.

Subsequently, the process shown in FIG. 8G is carried out. In this process, after the dry film 91 is removed, copper plating is performed with using the copper film 85b as a power source layer. By this means, the holes for forming the vias are filled with copper, and the copper plating is carried out so as to cover lands 30a made of metal layer formed to surround the holes for forming the vias. Then, gold plating 92 is carried out to the surfaces of the vias 90 formed by this copper plating.

Subsequently, the process shown in FIG. 8H is carried out. In this process, photoresist is applied to the copper film 85b, and a photoresist pattern is formed by photolithography process. Then, the copper film is etched and removed by alkali copper etching solution with using this photoresist as a mask, thereby forming wires 93. Thereafter, the photoresist is removed, and the adhesive layer 94 in which the holes 94a for forming vias are formed is formed so as to cover the wires 93.

In this case, for example, a polyimide-based adhesive sheet in its semi-hardened state can be used as the adhesive layer 94. As the adhesive layer 94 in which the holes 94a for forming vias are formed, a polyimide-based adhesive sheet in which holes are formed by laser process or punching process is bonded with pressurizing and heating it in vacuum, or a polyimide-based adhesive sheet is bonded with pressurizing and heating it in vacuum and then holes are formed by laser process or punching process.

Subsequently, the process shown in FIG. 8I is carried out. In this process, a conductive sheet 95 is brought into contact with gold plating 92 on the surfaces of the vias 90, and the holes 94a for forming vias of the copper wires 93 are filled with a conductive material 96 from the vias 90 through the copper wires 20a and the vias 87. As the conductive material 96 to be filled, for example, an appropriate amount of solder plating may be used, or after an appropriate amount of nickel 96a is plated, an appropriate amount of solder 96b is plated.

Figure 9:
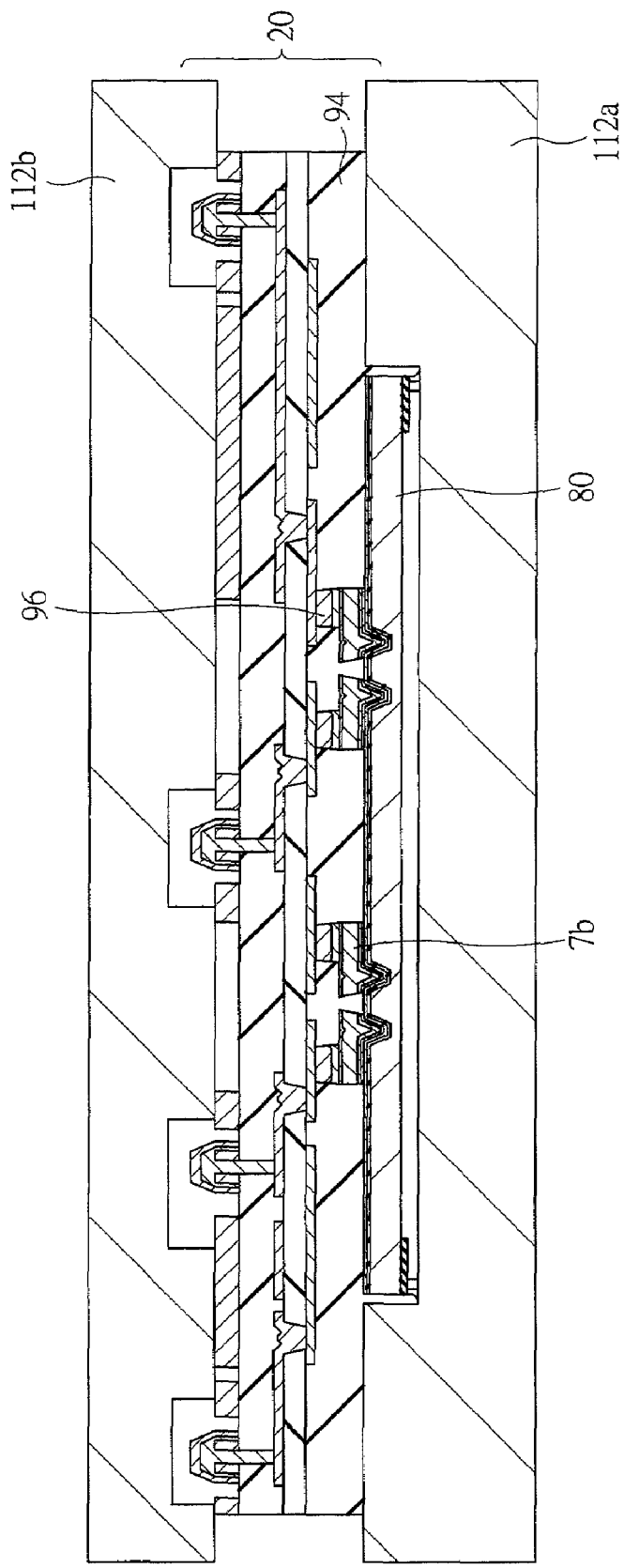
FIG. 9 is a cross sectional view showing the sequential manufacturing processes for forming a probe sheet in a probe cassette according to the present invention.

After the above-described processes are carried out, the process shown in FIG. 9 is carried out. In this process, the connection electrode portions 7b of the silicon wafer 80 in which the contact terminal portions 8 are formed in FIG. 5C are connected to the conductive materials 96 and the adhesive layer 94 of the wiring sheet formed in FIG. 8I, thereby forming an assembled probe sheet 20. Herein, for example, in the case where a polyimide-based adhesive sheet in its semi-hardened state is used as the adhesive layer, heating to a temperature of the glass transition point (Tg) of the adhesive layer 94 or more is applied while applying the pressure of 10 to 200 Kgf/cm², and heat and pressure adhesion is performed in vacuum with interposing the probe sheet between the substrates 112a and 112b for heat and pressure adhesion in vacuum.

Figure 10:
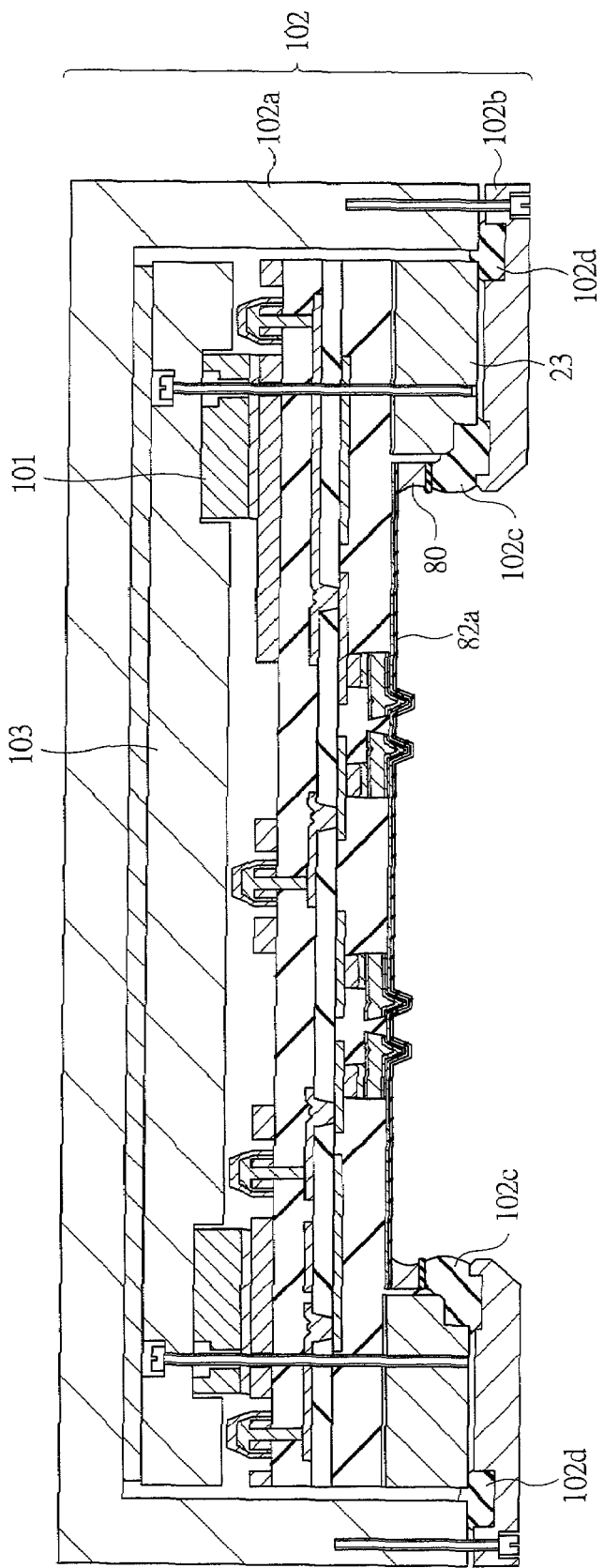
FIG. 10 is a cross sectional view showing the sequential manufacturing processes (subsequent to FIG. 9) for forming a probe sheet in a probe cassette according to the present invention.

Subsequently, the process shown in FIG. 10 is carried out. In this process, the upper supporting members 23 and the part mounting surface supporting members 101 are adhered and fixed to both the sides of the integrated probe sheet 20, and it is attached to a protective jig 102 for silicon etching and the silicon is etched and removed. For example, the part mounting surface supporting members 101 are screwed to an intermediate fixing plate 103 and attached between a fixing jig 102a made of stainless steel and a lid 102b made of stainless steel via O-rings 102c and 102d. Then, the silicon wafer 80 as a base member is etched and removed by strong alkali solution (for example, potassium hydroxide). In this case, the silicon wafer 80 can be etched and removed in strong alkali solution or by spraying strong alkali solution to its etching surface.

Figure 11:
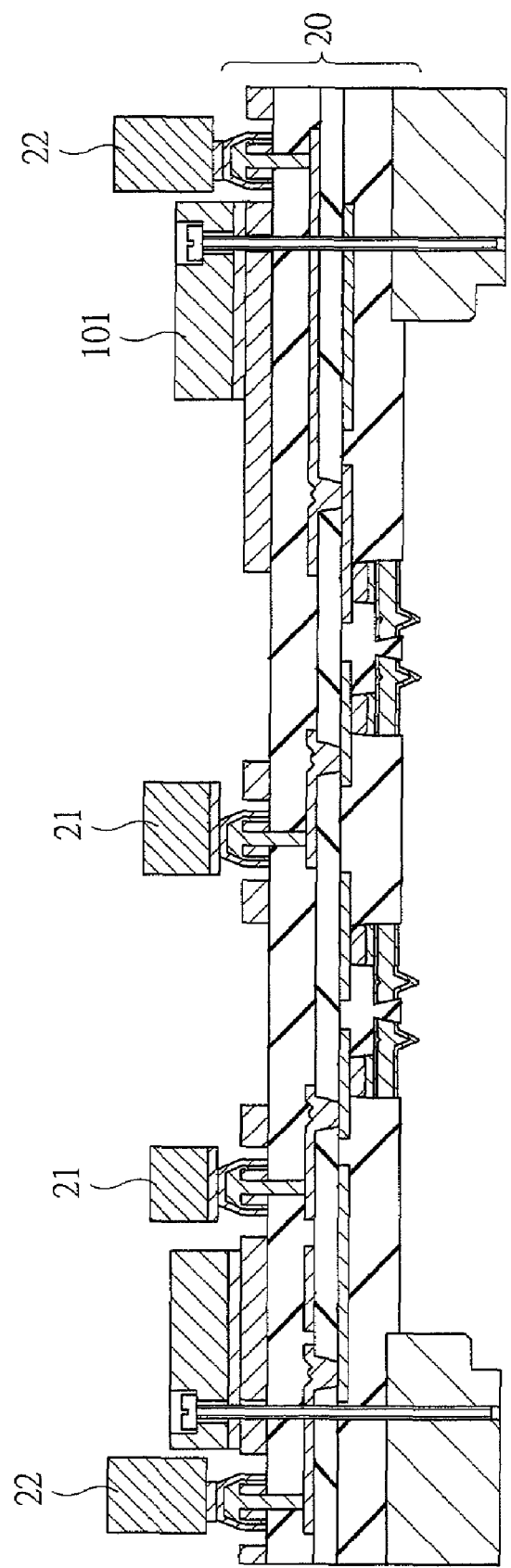
FIG. 11 is a cross sectional view showing the sequential manufacturing processes (subsequent to FIG. 10) for forming a probe sheet in a probe cassette according to the present invention.

Subsequently, the process shown in FIG. 11 is carried out. In this process, the protective jig 102 for silicon etching is detached, and a protective film is adhered to the surface of the probe sheet 20 to which the part mounting surface supporting members 101 are adhered. Then, the silicon dioxide film 82a, the conductive coating 83 (chromium and copper) and the nickel 8a are etched and removed, and the protective film is removed. Thereafter, the mounting parts 21 for inspection circuit and the connectors 22 for external wire connection are adhered and fixed to the probe sheet 20.

In this case, the silicon dioxide film 82a is etched and removed by mixed solution of hydrofluoric acid and ammonium fluoride, the chromium film is etched and removed by potassium permanganate solution, and the copper film and the nickel 8a are etched and removed by alkali copper etching solution.

Note that the reason why the rhodium 8b which is exposed on the contact terminal surface as a result of the series of etching processes is used is that solder, aluminum or the like which is the material of the electrode 3 hardly attaches thereto, the hardness thereof is higher than that of nickel, and it is hard to be oxidized and contact resistance thereof is stable.

Further, as shown in FIG. 2, the wafer 1 is interposed together with the buffer material 25 and the O-rings 26 between the upper supporting members 23 and the lower supporting member 24, and the contact terminals 7 formed on one surface of the probe sheet 20 disposed to oppose the electrodes 3 for inspection formed on the surface of the wafer 1 are brought into contact with the electrodes 3 with a desired atmospheric pressure by reducing the pressure through the vacuuming from a vacuuming port 24a provided in the lower supporting member 24. In this manner, the inspection apparatus of semiconductor device is attained.

Next, with regard to a manufacturing method of a probe cassette according to a second embodiment whose structure is slightly different from that of the probe cassette described above, the manufacturing processes thereof will be described with reference to FIG. 12 and FIG. 13.

Figure 4:
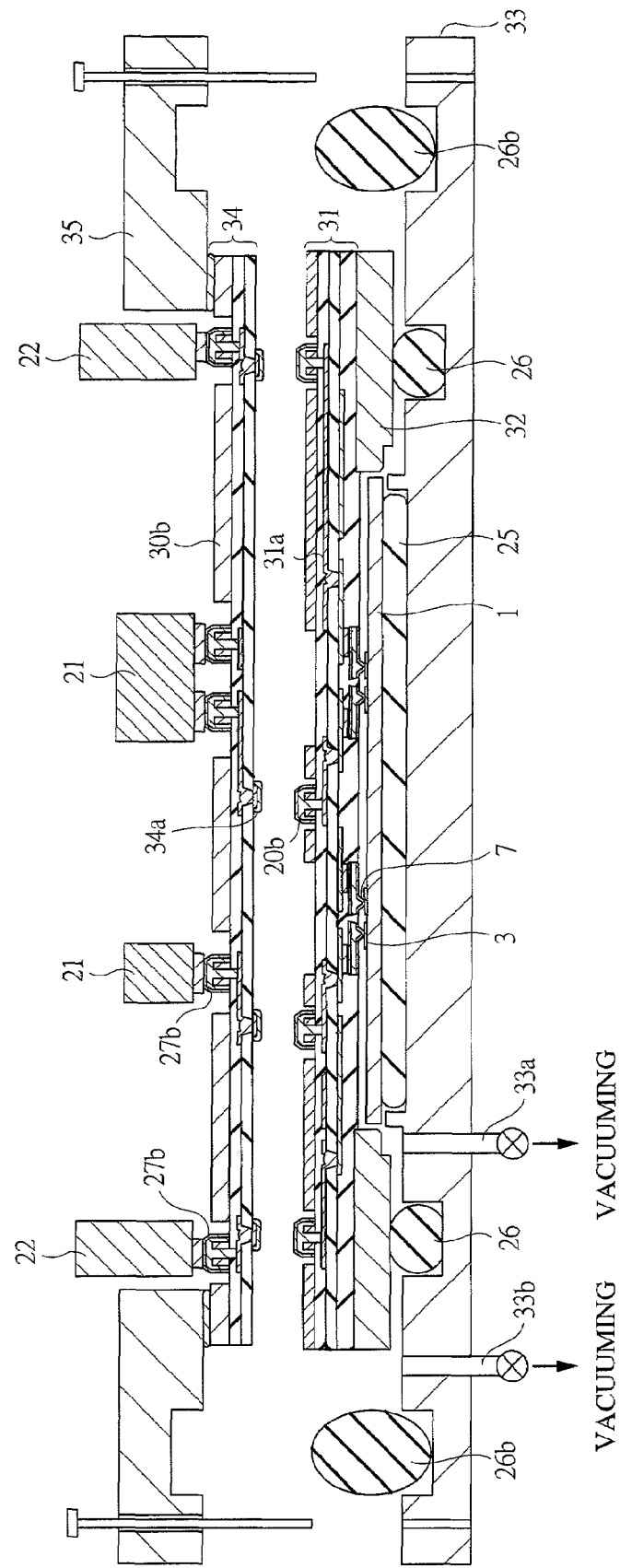
FIG. 4 is a cross sectional view showing the principal part of a probe cassette according to a second embodiment of the present invention.

The manufacturing method of a probe cassette shown in FIG. 4 is the same as that of a probe sheet described above in FIG. 5 to FIG. 11 except that a probe sheet in which the contact terminals 7 and the lead wires are formed and a wiring sheet to which the mounting parts 21 for inspection circuit are connected are separately manufactured.

The probe sheet in which electrodes whose pitch and arrangement are rewired from the contact terminals 7 to be contacted to the electrodes of the semiconductor device to be inspected are formed is formed as a common rewiring probe sheet, and on the other hand, exclusive part mounting wiring sheets in which mounting parts 21 for inspection circuit are connected and disposed are manufactured separately for various inspection processes such as initial wafer inspection, burn-in, sorting inspection and the like. Then, by selecting these exclusive part mounting sheets and performing a series of inspections using the selected sheet, only one probing mark is formed on the inspection electrode pad of the semiconductor device to be inspected. Therefore, the reliability of the wire bonding and the bump connection in the semiconductor device can be significantly improved, and thus, the highly reliable semiconductor device can be manufactured.

One example of the manufacturing method of a probe cassette by the use of the above-mentioned two types of probe sheets will be described with reference to FIG. 12 and FIG. 13.

Figure 12:
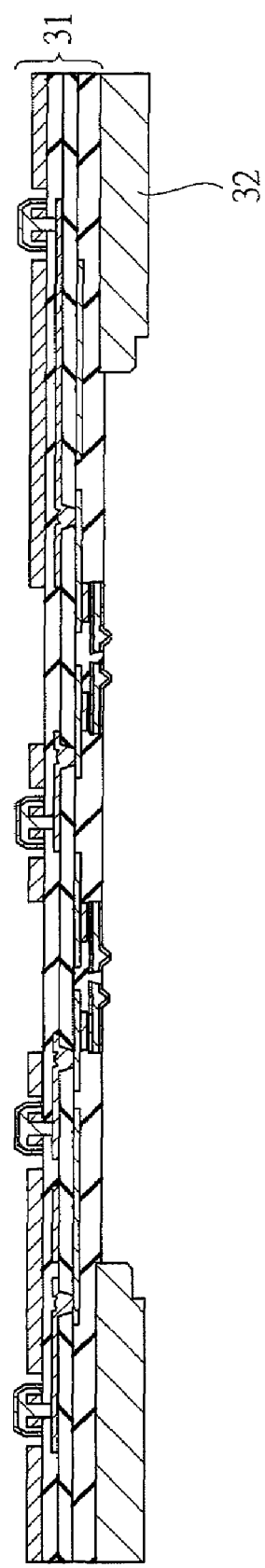
FIG. 12 is a cross sectional view showing a second manufacturing process for forming a probe sheet for rewiring in a probe cassette according to the present invention.

Through the same processes as those in FIG. 5A to FIG. 5C, FIG. 6A to FIG. 6C, FIG. 7D to FIG. 7F, FIG. 8G to FIG. 8I and FIG. 9 to FIG. 11, the rewiring probe sheet 31 shown in FIG. 12 is formed. However, the part mounting surface supporting members 101, the mounting parts 21 for inspection circuit and the connectors 22 for external wire connection are not adhered and fixed to this rewiring probe sheet 31.

Figure 13A:
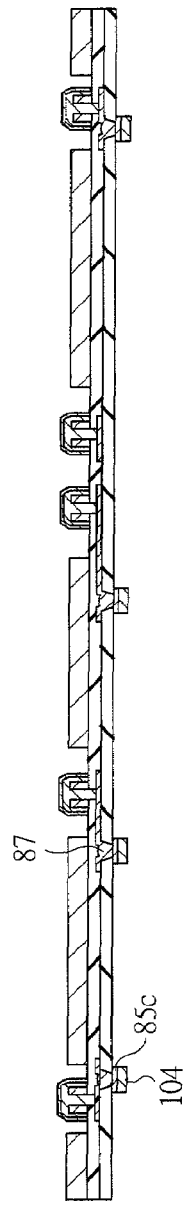
FIG. 13A and FIG. 13B are cross sectional views showing a second manufacturing process for forming a wiring sheet on which parts are mounted, in a probe cassette according to the present invention.

On the other hand, through the same processes as those in FIG. 6A to FIG. 6C, FIG. 7D to FIG. 7F, and FIG. 8G, a probe sheet is formed, and then, the process shown in FIG. 13A is carried out. In this process, photoresist 104 is applied to the copper film 85b, and a photoresist pattern is formed by photolithography process. Thereafter, the copper film at the positions corresponding to the vias 87 is etched so as to be left as electrodes 85c by alkali copper etching solution with using this photoresist 104 as a mask.

Figure 13B:
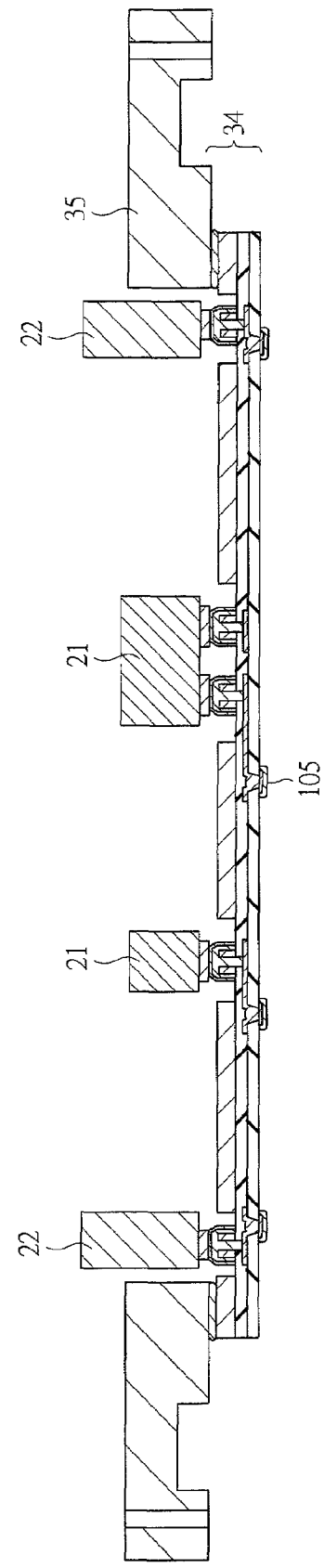

Subsequently, the process shown in FIG. 13B is carried out. In this process, the photoresist 104 is removed, and nickel plating and gold plating 105 are formed on the electrodes 85c. Thereafter, the uppermost supporting members 35, the mounting parts 21 for inspection circuit and the connectors 22 for external wire connection are adhered and fixed to the part mounting probe sheet 34.

Then, as shown in FIG. 4, the wafer 1 is interposed together with the buffer material 25 and the O-rings 26 between the intermediate supporting members 32 that adhere and fix the rewiring probe sheet 31 on which the contact bumps 20b which expand and rewire the arrangement of the contact terminals 7 into an arbitrary arrangement are formed and the lower supporting members 33, and the contact terminals 7 formed on the surface of the probe sheet 31 disposed to oppose the electrodes 3 for inspection formed on the surface of the wafer 1 are brought into contact with the electrodes 3 with a desired atmospheric pressure by reducing the pressure through the vacuuming from a vacuuming port 33a provided in the lower supporting member 33.

Subsequently, the wafer 1 is interposed between the probe sheet 31 adhered and fixed to the intermediate supporting members 32 and the lower supporting member 33 and is fixed through the vacuuming, and the O-rings 26b are interposed between the lower supporting member 33 and the uppermost supporting members 35 that adhere and fix the part mounting probe sheet 34 on which the mounting parts 21 for inspection circuit and the connectors 22 for external wire connection are connected. Then, by reducing the pressure through the vacuuming from the vacuuming port 33b provided in the lower supporting member 33, the contact with a desired atmospheric pressure can be performed. In this manner, the inspection apparatus of semiconductor device is attained. In this case, the vacuuming is carried out again from the vacuuming port 33a according to need, so that the electrodes 3 of the wafer 1 and the contact terminals 7 of the probe sheet 31 are finally brought into contact to each other at a desired pressure.

Alternatively, after positioning the contact terminals 7 formed on the probe sheet 31 so as to oppose the electrodes 3 for inspection formed on the surface of the wafer 1, for example, knock pins (not illustrated) disposed in the lower supporting member 33 are inserted into knock pin holes (not illustrated) of the intermediate supporting members 32, the intermediate supporting members 32 are temporarily fixed to the lower supporting member 33 by the magnetic force of an electric magnet (not illustrated) disposed in the lower supporting member 33, or the intermediate supporting members 32 are temporarily fixed to the lower supporting member 33 by adhesive. By this means, it becomes unnecessary to fix the probe sheet 31 to the lower supporting member 33 by reducing the pressure, and the O-rings 26 and the vacuuming port 33a are omitted. Then, by interposing the probe sheet 31 adhered and fixed to the intermediate supporting members 32 and the O-rings 26b between the lower supporting member 33 and the uppermost supporting members 35 that adhere and fix the part mounting probe sheet 34 and performing the vacuuming from the vacuuming port 33b provided in the lower supporting member 33 to reduce the pressure, the contact terminals 7 formed in the probe sheet 31 are brought into contact to the electrodes 3 for inspection formed on the surface of the wafer 1 at a desired atmospheric pressure. In this manner, the inspection apparatus of semiconductor device is attained.

In the semiconductor inspection apparatus using the probe cassette according to the first or second embodiment of the present invention described above, if a silicon wafer of the same size as or a larger size than the size of the semiconductor device to be inspected is used as a wafer serving as a base member for forming tip portions of contact terminals, entire contact terminals can be manufactured by one wafer. However, it is needless to mention that a probe sheet in which contact terminals are formed individually from a plurality of small size wafers used as base members can be manufactured. For example, in the case where a bulk inspection of ϕ200 mm wafer is to be performed, necessary parts of four wafers of ϕ150 mm on which tip portions of contact terminals corresponding to ¼ of the ϕ200 mm wafer are formed can be cut and used in combination.

A representative example thereof is shown in FIG. 14. FIG. 14A shows an example where a semiconductor element formation area 110a of a ϕ200 mm wafer 110 is covered by four ϕ150 mm wafers 111. FIG. 14B shows an example where ¼ of a contact terminal formation area 111a of the semiconductor element formation area 110a of the ϕ200 mm wafer 110 is formed on a ϕ150 mm wafer 111. FIG. 14C and FIG. 14D show cut wafers 111b and 111c obtained by removing the overlapped portions of the wafers 111, in order to obtain the necessary semiconductor element formation area 110a by combining the wafers 111 on which the contact terminal formation areas 111a are formed.

FIG. 15 to FIG. 17 show an example of the manufacturing method using the cut wafer 111b or 111c, in which the semiconductor element formation area 110a is divided into four areas, and the wafers 111 on which the divided contact terminal formation areas 111a are formed are cut and used in combination.

FIG. 15 shows a manufacturing process corresponding to FIG. 9 of the manufacturing process described above, in which the separated cut wafers 111b or cut wafers 111c on which tip portions of contact terminals are formed are disposed in the substrate 112a and 112b for heat and pressure adhesion in vacuum.

FIG. 16 shows a manufacturing process corresponding to FIG. 10 of the manufacturing process described above, in which the separated cut wafers 111b or cut wafers 111c on which tip portions of contact terminals are formed are disposed in a lid 102e used as a silicon etching protective jig 102 which is provided with a member 113 covering the border of the separated cut wafers 111b or 111c, and FIG. 17 is a perspective view of FIG. 16 viewed from below. In this case, for example, as the member covering the border of the cut wafers 111b or 111c, a fluoride-based rubber material can be used, and as the lid 102e, a stainless steel can be used.

Also, by arbitrarily dividing the wafer to be inspected in accordance with the size of a probe cassette into the divided wafers with the same size as or a smaller size than the size of the probe cassette, the divided wafer can be set in the probe cassette and used for the inspection.

FIG. 18A is a plan view showing the semiconductor element formation area 110a which is a target to be inspected formed on the wafer 110, and FIG. 18B is a plan view showing a cut wafer 114 having a contact terminal formation area 111a obtained by dividing the wafer 110 into four areas. As a probe for inspection, a probe sheet that can collectively contact the semiconductor element formation area 110a of the wafer 110 can be formed as described above. Alternatively, by mounting the separated cut wafer 114 as shown in FIG. 18B on the lower supporting member 24 or 33, the divided contact terminal formation areas 111*a* can be sequentially inspected using a probe sheet where contact terminals that can contact it are formed.

FIG. 19A is a plan view showing the semiconductor element formation area 110*a* which is a target to be inspected formed on the wafer 110. In this case, as a probe for inspection, a probe sheet that can collectively contact the semiconductor element formation area 110*a* of the wafer 110 can be formed as described above. Alternatively, for example, by manufacturing one or more types of probe sheets which can contact the elements (shaded portion in the figures) of semiconductor elements 117*a* and 117*b* arranged alternately as shown in FIG. 19B and FIG. 19C according to need and sequentially using them for the inspection, the entire semiconductor element formation area 110*a* can be inspected.

Further, by forming the contact terminals 7 and the contact bumps 20*b* of the entire semiconductor element formation area 110*a* in a probe sheet (rewiring sheet) 31, forming contact electrodes 34*a* arranged alternately on probe sheets (part mounting sheet) 34, and then sequentially changing the probe sheets 34, the entire semiconductor element formation area 110*a* can be inspected.

Further, in order to fix the wafer 1 as shown in FIG. 20, for example, by forming the holes 25*a* in the buffer material 25 and performing the vacuuming from the vacuuming port 33*c*, the wafer 1 can be disposed on the lower supporting members 33 by vacuum chuck mechanism. Further, the buffer material 25 can be omitted according to need. The fixing mechanism of the wafer 1 as shown in FIG. 20 can be applied to the probe cassette in FIG. 2 or FIG. 4 according to need.

Meanwhile, in order to prevent disturbance of electrical signals as a probe for high-speed electrical signal inspection, a structure where a ground layer is formed on the surface (both surfaces or one surface) of a probe sheet is preferable. For example, as shown in FIG. 21, on the surface on which the lead wires 20*a* are formed, a polyimide film 116 and a ground layer 115*a* are further formed. Alternatively, as shown in FIG. 22, by leaving the metal film 30 as much as possible, it can be used as the ground layer 115*b*. Further, as shown in FIG. 23, just after the state shown FIG. 10 where the silicon wafer 80 is etched and removed and the silicon dioxide film 82*a* is etched and removed, at the step where the conductive coating 83 is exposed on the surface, a photoresist mask is formed on the conductive coating 83. By this means, the ground layer 115*c* can be formed from the conductive coating 83.

Further, after the state shown FIG. 11, the ground layer 115*c* can be formed on the formation surface of the contact terminals 7. When this ground layer 115*c* is formed by sputtering, for example, chromium, titanium, copper, gold, nickel and others can be used singly or in combination as a sputter film material.

It is needless to mention that the method of forming the ground layer of the probe sheet can be applied also to the probe cassette of any manufacturing method of FIG. 2, FIG. 4 and FIG. 20.

As described above, according to the probe cassette of the present embodiment, in the case where a probe sheet is formed through the manufacturing process shown in FIG. 2 to FIG. 23, the contact terminals 7 can be formed to have a pyramidal shape or truncated pyramidal shape. Accordingly, in comparison with the contact of conventional semispherical plating bumps or plate electrodes, stable contact characteristic values can be realized using hard contact terminals at low contact pressure. Further, since the probe sheet is formed by photolithography process where it is backed by the metal film 30 whose linear expansion ratio is the same as that of silicon wafer, it is possible to easily realize the highly accurate tip contact between the contact terminals of the probe sheet and the electrodes of semiconductor elements even in a large contact area.

Next, one example of a semiconductor inspection apparatus using the probe cassette according to the present invention described above will be described with reference to FIG. 24. FIG. 24 is a diagram showing the entire structure of an inspection system including the semiconductor inspection apparatus using the probe cassette (FIG. 2) according to the first embodiment of the present invention. Note that the structure is the same even in a semiconductor inspection apparatus using the probe cassette (FIG. 4) according to the second embodiment or another probe cassette of modified example thereof.

FIG. 24 shows an inspection apparatus that performs an electrical characteristic inspection by applying a desired load on the surface of the wafer 1. In this state, vacuuming is carried out from the vacuuming port 24*a* to reduce the pressure, and thus, a desired atmospheric pressure is applied to the contact terminals 7 formed on the probe sheet 20. Then, via the contact terminals in contact with the electrodes 3 of the wafer 1, the lead wires 20*a*, the peripheral electrodes 27, the connectors 22, and the cable 22*a*, electrical signals for inspection are sent and received with a tester 170 which performs electrical characteristic inspection of the semiconductor device.

In the entire structure of the inspection system according to the present embodiment, a probe cassette is configured as a full wafer prober. This inspection system includes a sample support system 160 which supports the wafer 1 to be inspected and is connected to a vacuuming device (not shown), the probe sheet 20 which is brought into contact with the electrodes 3 of the wafer 1 and performs transmission and reception of electrical signals, a vacuum degree control system 150 which controls the load (atmospheric pressure) applied to the probe sheet 20 of the sample support system 160, a temperature control system 140 which controls the temperature of the wafer 1, and the tester 170 which performs the inspection of the electrical characteristics of the wafer 1. A plurality of semiconductor elements are arranged on the wafer 1, and a plurality of electrodes 3 as external connection electrodes are arranged on the surface of each semiconductor element.

For example, the probe sheet 20 shown in FIG. 24 is connected to the tester 170 via the contact terminals 7, the lead wires 20*a*, the peripheral electrodes 27, the connectors 22 and the cable 22*a*.

In this case, in order to prevent position misalignment due to the temperature difference between the wafer 1 which is heated to a desired temperature by a heater and the probe sheet 20 on which the contact terminals 7 for carrying out electrical signal inspection by contacting the electrodes of the wafer 1 are formed and to carry out positioning accurately in a short period of time, a heating element capable of controlling its temperature may be provided in the probe sheet or on the surface of the probe cassette in advance. In order to form the heating element, for example, a metal material having a high resistance value such as nickel chrome or a high-resistance conductive resin may be directly formed in the probe sheet, or a sheet made of such a material may be attached to the probe sheet. Alternatively, a heated liquid is caused to flow in a tube in a heat block as a heating element and the heat block may be brought into contact with the probe sheet. Further, the atmosphere of a desired temperature can be realized by putting the entire probe cassette in a constant-temperature chamber.

Different from the conventional method where the temperature of probe cassette is determined from the heat radiation from the heated wafer and the contact at probing, in the method where the probe sheet is independently maintained at a temperature at the time of inspection as described above, it is possible to prevent temperature difference at the time of inspection between the wafer and the probe sheet. In addition, since the probe sheet backed by a metal film with almost the same linear expansion ratio as that of silicon is used, the probing with precise positional accuracy is possible.

A heater 141 for heating the wafer 1 is installed in the sample stage 162. The temperature control system 140 controls the heater 141 of the sample stage 162 or a cooling jig, thereby controlling the temperature of the wafer 1 mounted on the sample stage 162. Further, the temperature control system 140 has an operating unit 151, and it receives the inputs of various instructions concerning temperature control. For example, it receives instruction of manual operation. Herein, the temperature controllable heating element provided in a part of the probe sheet or the probe cassette and the heater 141 of the sample stage 162 can be operated in conjunction with each other so as to control the temperature.

The vacuum degree control system 150 controls the vacuum degree in accordance with the progress information of test operation of the tester 170 transmitted via the cable 171 and the temperature information from the temperature control system 140. Further, the vacuum degree control system 150 has an operating unit 151, and it receives the input of various instructions concerning vacuum degree control. For example, it receives instruction of manual operation.

Hereinafter, operations of the semiconductor inspection apparatus will be described. First, the wafer 1 to be inspected is placed on the buffer layer 25 mounted on the lower supporting member 24, and many contact terminals 7 arranged on the probe sheet 20 are positioned just under the electrodes 3 formed on a plurality of semiconductor elements disposed on the wafer 1, and the vacuuming is performed to fix the probe sheet. In this manner, the probe cassette is prepared. Next, after this probe cassette is placed on the sample stage 162, the vacuum degree control system 150 is operated to perform the vacuuming from the vacuuming port 24a, thereby appropriately controlling the vacuum degree. By this means, pressing force is applied to the contact terminals 7 formed on the probe sheet 20 via a desired atmospheric pressure. Then, respective tips of many pyramidal or truncated pyramidal contact terminals 7 which are highly accurately positioned are pressed so as to follow the surfaces of (entire) electrodes of many electrodes 3 arranged on the semiconductor device, and contact to respective electrodes 3 arranged on the wafer 1 can be made with uniform load (about 3 to 150 mN). Thus, the respective contact terminals 7 and the respective electrodes 3 are connected at a low resistance (0.01Ω to 0.1Ω).

Further, operation current and operation inspection signals are sent and received between the wafer 1 and the tester 170 via the cable 22a, the connectors 22, the peripheral electrodes 27, the lead wires 20a and the contact terminals 7, and the operation characteristics of the concerned semiconductor device are determined.

Finally, a representative example of the manufacturing method of a semiconductor device including the inspection process or the inspection method using the above-described semiconductor inspection apparatus will be described with reference to FIG. 25.

(1) A manufacturing method of a semiconductor device according to the present invention includes a step of creating circuits on a wafer to form semiconductor elements (semiconductor element circuit formation), a step of collectively inspecting the electrical characteristics of a plurality of semiconductor devices in a wafer level by the semiconductor inspection apparatus according to the present invention (wafer inspection), a step of cutting the wafer and separating it into semiconductor elements (dicing), and a step of sealing the semiconductor elements with resin or the like (assembly, sealing). Thereafter, through burn-in, sorting inspection, and external appearance inspection, they are shipped as chip package products.

(2) A manufacturing method of a semiconductor device according to the present invention includes a step of creating circuits on a wafer to form semiconductor elements (semiconductor element circuit formation), a step of collectively inspecting the electrical characteristics of a plurality of semiconductor devices in a wafer level by the semiconductor inspection apparatus according to the present invention (wafer inspection), a step of cutting the wafer and separating it into semiconductor elements (dicing), and a step of sealing the semiconductor elements with resin or the like (assembly, sealing). Thereafter, through chip inspection socket attachment, burn-in, sorting inspection, removal from socket, and external appearance inspection, they are shipped as bare chip shipping products.

(3) A manufacturing method of a semiconductor device according to the present invention includes a step of creating circuits on a wafer to form semiconductor elements (semiconductor element circuit formation), and a step of collectively inspecting the electrical characteristics of a plurality of semiconductor devices in a wafer level by the semiconductor inspection apparatus according to the present invention (wafer inspection). Thereafter, through burn-in, sorting inspection, and external appearance inspection, they are shipped as full wafer shipping products. Also in the burn-in and sorting inspection, the inspection by the semiconductor inspection apparatus according to the present invention is carried out.

(4) A manufacturing method of a semiconductor device according to the present invention includes a step of creating circuits on a wafer to form semiconductor elements (semiconductor element circuit formation), and a step of collectively inspecting the electrical characteristics of a plurality of semiconductor devices in a wafer level by the semiconductor inspection apparatus according to the present invention (wafer inspection). Thereafter, through burn-in, external appearance inspection, a step of cutting the wafer and separating it into semiconductor elements (dicing), and external appearance inspection, they are shipped as bare chip shipping products. Also in the burn-in and sorting inspection, the inspection by the semiconductor inspection apparatus according to the present invention is carried out.

(5) A manufacturing method of a semiconductor device according to the present invention includes a step of creating circuits on a wafer to form semiconductor elements (semiconductor element circuit formation), a step of separating the wafer (wafer separation), and a step of collectively inspecting the electrical characteristics of a plurality of semiconductor devices in separated wafer levels by the semiconductor inspection apparatus according to the present invention (separated wafer inspection). Thereafter, through burn-in, sorting inspection, and external appearance inspection, they are shipped as separated wafer shipping products. Also in the burn-in and sorting inspection, the inspection by the semiconductor inspection apparatus according to the present invention is carried out.

(6) A manufacturing method of a semiconductor device according to the present invention includes a step of creating circuits on a wafer to form semiconductor elements (semiconductor element circuit formation), a step of separating the wafer (wafer separation), and a step of collectively inspecting the electrical characteristics of a plurality of semiconductor devices in separated wafer levels by the semiconductor inspection apparatus according to the present invention (separated wafer inspection). Thereafter, through burn-in, sorting inspection, a step of cutting the separated wafers into semiconductor elements (dicing), and external appearance inspection, they are shipped as bare chip shipping products. Also in the burn-in and sorting inspection, inspection by the semiconductor inspection apparatus according to the present invention is carried out.

(7) A manufacturing method of a semiconductor device according to the present invention includes a step of creating circuits on a wafer to form semiconductor elements (semiconductor element circuit formation), a step of forming a resin layer and the like on the wafer (resin layer formation), and a step of collectively inspecting the electrical characteristics of a plurality of semiconductor elements formed on the wafer on which the resin layer and the like are formed by the semiconductor inspection apparatus according to the present invention (wafer inspection). Thereafter, through burn-in, sorting inspection, a step of cutting the wafer and separating it into semiconductor elements (dicing), and external appearance inspection, they are shipped as CSP shipping products. Also in the burn-in and sorting inspection, the inspection by the semiconductor inspection apparatus according to the present invention is carried out.

(8) A manufacturing method of a semiconductor device according to the present invention includes a step of creating circuits on a wafer to form semiconductor elements (semiconductor element circuit formation), a step of forming a resin layer and the like on the wafer (resin layer formation), and a step of collectively inspecting the electrical characteristics of a plurality of semiconductor elements formed on the wafer on which the resin layer and the like are formed by the semiconductor inspection apparatus according to the present invention (wafer inspection). Thereafter, through burn-in, sorting inspection, and external appearance inspection, they are shipped as full wafer CSP shipping products. Also in the burn-in and sorting inspection, the inspection by the semiconductor inspection apparatus according to the present invention is carried out.

(9) A manufacturing method of a semiconductor device according to the present invention includes a step of creating circuits on a wafer to form semiconductor elements (semiconductor element circuit formation), a step of forming a resin layer and the like on the wafer (resin layer formation), a step of separating the wafer on which the resin layer and the like are formed (wafer separation), and a step of collectively inspecting the electrical characteristics of a plurality of semiconductor devices in separated wafer levels by the semiconductor inspection apparatus according to the present invention (separated wafer inspection). Thereafter, through burn-in, sorting inspection, and external appearance inspection, they are shipped as separated wafer CSP shipping products. Also in the burn-in and sorting inspection, inspection by the semiconductor inspection apparatus according to the present invention is carried out.

(10) A manufacturing method of a semiconductor device according to the present invention includes a step of creating circuits on a wafer to form semiconductor elements (semiconductor element circuit formation), a step of forming a resin layer and the like on the wafer (resin layer formation), a step of separating the wafer on which the resin layer and the like are formed (wafer separation), and a step of collectively inspecting the electrical characteristics of a plurality of semiconductor devices at separated wafer levels by the semiconductor inspection apparatus according to the present invention (separated wafer inspection). Thereafter, through burn-in, sorting inspection, a step of cutting the wafer and separating it into semiconductor elements (dicing), and external appearance inspection, they are shipped as CSP shipping products. Also in the burn-in and sorting inspection, the inspection by the semiconductor inspection apparatus according to the present invention is carried out.

In the step of inspecting electrical characteristics of semiconductor elements in the manufacturing methods of a semiconductor device described above, preferable contact characteristics can be obtained with excellent positional accuracy by use of a probe cassette according to the present invention.

More specifically, since an inspection is carried out by use of pyramidal or truncated pyramidal contact terminals 7 which are formed by the plating in which holes of a substrate having crystallinity formed by anisotropic etching are used as casts, it is possible to realize stable contact characteristics with low contact pressure and perform the inspection without damaging the underlying semiconductor elements. Further, since a plurality of contact terminals 7 are surrounded by the metal film 30 having the same linear expansion ratio as that of the wafer 1, unnecessary stress are not applied to the contact terminals even in the inspection operations, and the contact terminals can make contact while maintaining the precise relative positions with the electrodes 3 of the wafer 1.

Furthermore, the probing mark on the electrode of the semiconductor element is small and is in a form of a dot (concave dot in pyramidal or truncated pyramidal shape). Therefore, a flat area with almost no probing mark is left on the electrode surface, and it does not matter even when inspection by means of the contact is performed a plurality of times like that shown in FIG. 25.

In particular, in the case of the structure using two probe sheets 31 and 34 shown in FIG. 4, even when inspection processes such as initial characteristic inspection, burn-in, and sorting inspection are performed a plurality of times, since the probe sheet 31 for rewiring is used as a common sheet for respective inspections and the probe sheet 34 mounting inspection parts exclusive for respective inspections is adhered in vacuum, the probing mark on the electrode 3 of the wafer 1 due to a series of inspection processes of semiconductor elements is formed only in one portion even after the completion of all the inspection processes. Accordingly, damage to pad is small, and it is possible to improve the reliability in the following connection processes of semiconductor elements (wire bonding, solder bump formation, gold bump formation, gold-tin bonding, and the like).

Further, since the probe sheet 31 with rewiring arrangement formed therein is used and it is fixed to the wafer 1 to be inspected by the vacuuming in a contact state, it is possible to handle it as a wafer molded for the inspection (wafer carrier), and handling in inspection processes can be facilitated.

Furthermore, since pyramidal or truncated pyramidal contact terminals formed on a flexible thin film probe sheet are contacted to electrodes of a wafer by reducing the pressure, it is possible to make contact between the contact terminals and the electrodes of a wafer at uniform pressure by the use of atmospheric pressure with a simple pressing mechanism, and it is possible to realize a stable contact resistance value even in a large area.

Moreover, since necessary electronic components (for example, resistors, capacitors, fuses, and connectors) can be readily disposed and mounted on the rear surface of the probe sheet so as to be close to the contact terminals of the probe sheet by using the thin-film wiring circuit formation technologies, stable inspection and circuit operations can be realized.

In the foregoing, the invention made by the inventors of the present invention has been concretely described based on the embodiments. However, it is needless to say that the present invention is not limited to the foregoing embodiments and various modifications and alterations can be made within the scope of the present invention.

INDUSTRIAL APPLICABILITY

The present invention relates to a technology for manufacturing a semiconductor device. More specifically, it relates to a technology effectively applied to a probe cassette using a probe sheet, a semiconductor inspection apparatus using the probe cassette, and a manufacturing method of a semiconductor device using the semiconductor inspection apparatus.

What is claimed is:

1. A manufacturing method of a semiconductor device comprising:
   a step of creating circuits on a wafer to form a plurality of semiconductor devices; and
   a step of collectively inspecting electrical characteristics of the plurality of semiconductor devices in a state of the wafer by using a semiconductor inspection apparatus,
   wherein the semiconductor inspection apparatus comprises:
      a probe sheet including a plurality of contact terminals which contact electrodes provided on the wafer and are formed to have a pyramidal or truncated pyramidal shape, wires led out from the plurality of contact terminals, a plurality of peripheral electrodes electrically connected to the wires and having first peripheral electrodes connected to connection terminals for a tester and second peripheral electrodes having terminals of parts for an inspection circuit, and a metal film which is formed so as to surround the plurality of contact terminals and has almost the same linear expansion ratio as the wafer;
      a supporting member which interposes the wafer with the probe sheet;
      a tester which is connected to connection terminals for a tester of a probe cassette including the probe sheet and the supporting member and inspects electrical characteristics of a semiconductor device mounted in the probe cassette; and
      a vacuum degree control system which reduces pressure in a space between the probe sheet and the supporting member and controls a load applied between electrodes of the semiconductor device and the plurality of contact terminals.

2. The manufacturing method of a semiconductor device according to claim 1,
   wherein the metal film is 42 alloy or invar.

3. The manufacturing method of a semiconductor device according to claim 2,
   wherein a buffer material and an o-ring are disposed between an upper supporting member that adheres and fixes the probe sheet and a lower supporting member provided with the supporting member and a vacuuming port through which pressure can be reduced by vacuuming.

4. The manufacturing method of a semiconductor device according to claim 1,
   wherein a linear expansion ratio of the metal film is equal to a linear expansion ratio of the wafer.

5. The manufacturing method of a semiconductor device according to claim 4,
   wherein the probe sheet can be replaced in accordance with types of inspection.

6. The manufacturing method of a semiconductor device according to claim 5, further comprising:
   a step of cutting the wafer and separating it into respective semiconductor devices; and
   a step of sealing the semiconductor devices with resin.

7. The manufacturing method of a semiconductor device according to claim 1,
   wherein, in the step of collectively inspecting electrical characteristics of the plurality of semiconductor devices, electrical characteristics of the plurality of semiconductor devices arranged alternately are inspected and this inspection is repeated, thereby collectively inspecting the semiconductor devices created on the wafer.

8. The manufacturing method of a semiconductor device according to claim 1,
   a step of cutting the wafer and separating it into respective semiconductor devices; and
   a step of sealing the semiconductor devices with resin.

9. The manufacturing method of a semiconductor device according to claim 3,
   a step of cutting the wafer and separating it into respective semiconductor devices; and
   a step of sealing the semiconductor devices with resin.

\* \* \* \* \*